(12) United States Patent
Owaki et al.

(10) Patent No.: US 8,471,434 B2
(45) Date of Patent: Jun. 25, 2013

(54) SURFACE ACOUSTIC WAVE DEVICE, SURFACE ACOUSTIC WAVE OSCILLATOR, AND ELECTRONIC APPARATUS

(75) Inventors: Takuya Owaki, Minowa (JP); Kunihito Yamanaka, Minowa (JP)

(73) Assignee: Seiko Epson Corporation (JP)

( * ) Notice: Subject to any disclaimer, the term of this patent is extended or adjusted under 35 U.S.C. 154(b) by 133 days.

(21) Appl. No.: 13/212,725

(22) Filed: Aug. 18, 2011

(65) Prior Publication Data

US 2012/0049968 A1 Mar. 1, 2012

(30) Foreign Application Priority Data

Aug. 26, 2010 (JP) ................................ 2010-189863

(51) Int. Cl.
*H01L 41/08* (2006.01)

(52) U.S. Cl.
USPC .................................. 310/313 A; 310/313 B

(58) Field of Classification Search
USPC .................................. 310/313 A, 313 R, 360
See application file for complete search history.

(56) References Cited

U.S. PATENT DOCUMENTS

| | | | |
|---|---|---|---|
| 382,217 A | 5/1888 | Davies | |
| 4,387,355 A | 6/1983 | Uno et al. | |
| 5,179,310 A | 1/1993 | Satoh et al. | |
| 6,154,105 A | 11/2000 | Fujimoto et al. | |
| 6,329,888 B1 | 12/2001 | Hirota | |
| 6,414,414 B1 | 7/2002 | Wright | |
| 6,774,747 B2 | 8/2004 | Yamazaki et al. | |
| 6,784,595 B2 | 8/2004 | Iizawa et al. | |
| 6,856,218 B2 | 2/2005 | Yamazaki et al. | |
| 6,946,930 B2 | 9/2005 | Kadota et al. | |
| 7,135,805 B2 | 11/2006 | Yamanouchi | |
| 7,315,805 B2 | 1/2008 | Slater | |
| 7,352,104 B2 | 4/2008 | Yamazaki et al. | |
| 7,382,217 B2 | 6/2008 | Morita et al. | |
| 7,589,451 B2 | 9/2009 | Morita et al. | |
| 7,696,675 B2 | 4/2010 | Kanna | |
| 8,063,534 B2 | 11/2011 | Iizawa | |
| 8,084,918 B2 | 12/2011 | Iizawa | |
| 8,305,162 B2 | 11/2012 | Yamanaka | |
| 2002/0171512 A1 | 11/2002 | Kadota et al. | |
| 2003/0030513 A1 | 2/2003 | Yamazaki et al. | |
| 2003/0052572 A1 | 3/2003 | Iizawa et al. | |

(Continued)

FOREIGN PATENT DOCUMENTS

| JP | 54-156455 | 12/1979 |
|---|---|---|
| JP | 57-005418 | 1/1982 |

(Continued)

OTHER PUBLICATIONS

Takehiko Uno, Nobuhide Miyamoto and Hiroshi Abe (Electrical Communication Laboratories, NTT), "Fabrication of SAW Resonators with Groove Gratings and their Characteristics", (Oct. 18, 1982) (pp. 45-52) with English translation.

(Continued)

*Primary Examiner* — Mark Budd
(74) *Attorney, Agent, or Firm* — Harness, Dickey & Pierce, P.L.C.

(57) ABSTRACT

A surface acoustic wave device includes: a quartz substrate with Euler angles of ($\phi$, $\theta$, $\psi$); and an IDT which excites a surface acoustic wave in an upper mode of a stop band; wherein, the Euler angle $\phi$ is $-60° \leq \phi \leq 60°$, and the Euler angle $\phi$ determines the ranges of the Euler angles $\theta$ and $\psi$.

12 Claims, 34 Drawing Sheets

U.S. PATENT DOCUMENTS

| | | |
|---|---|---|
| 2003/0146810 A1 | 8/2003 | Yamazaki et al. |
| 2004/0135469 A1 | 7/2004 | Kanna |
| 2004/0201306 A1 | 10/2004 | Yamanouchi |
| 2005/0127781 A1 | 6/2005 | Yamazaki et al. |
| 2006/0108894 A1 | 5/2006 | Kanna |
| 2006/0145568 A1 | 7/2006 | Morita et al. |
| 2007/0182278 A1 | 8/2007 | Kanna |
| 2008/0084134 A1 | 4/2008 | Morita et al. |
| 2009/0026955 A1 | 1/2009 | Otterstatter et al. |
| 2009/0206955 A1 | 8/2009 | Iizawa |
| 2010/0001617 A9 | 1/2010 | Kanna |
| 2010/0219913 A1 | 9/2010 | Yamanaka |
| 2010/0244626 A1 | 9/2010 | Yamanaka |
| 2011/0309897 A1 | 12/2011 | Yamanaka |
| 2012/0049969 A1 | 3/2012 | Owaki et al. |
| 2012/0049979 A1 | 3/2012 | Owaki et al. |
| 2012/0062069 A1 | 3/2012 | Yamanaka |
| 2012/0062329 A1 | 3/2012 | Yamanaka |
| 2012/0086308 A1 | 4/2012 | Obata et al. |

FOREIGN PATENT DOCUMENTS

| | | |
|---|---|---|
| JP | 575418 | 1/1982 |
| JP | 57-099813 | 6/1982 |
| JP | 58-033309 | 2/1983 |
| JP | 58033309 A | 2/1983 |
| JP | 61-092011 | 5/1986 |
| JP | 01034411 A | 2/1989 |
| JP | 134411 | 7/1989 |
| JP | 01-231412 | 9/1989 |
| JP | 02-189011 | 7/1990 |
| JP | 03-284009 | 12/1991 |
| JP | 05-090865 | 4/1993 |
| JP | 590865 | 4/1993 |
| JP | 11-214958 | 8/1998 |
| JP | 10-270974 | 10/1998 |
| JP | 11-298290 | 10/1999 |
| JP | 2000-188521 | 7/2000 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-258601 | 9/2003 |
| JP | 2005-012736 | 1/2005 |
| JP | 2006-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 3851336 | 9/2006 |
| JP | 2006-295311 | 10/2006 |
| JP | 2006-339742 | 12/2006 |
| JP | 3897229 | 1/2007 |
| JP | 2007-028664 | 2/2007 |
| JP | 2007093213 A | 4/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2007333500 A | 12/2007 |
| JP | 2008-078984 | 4/2008 |
| JP | 2008-236295 | 10/2008 |
| JP | 2008286520 A | 11/2008 |
| JP | 2008286521 A | 11/2008 |
| JP | 2009-225420 | 10/2009 |
| JP | 2010-233203 | 10/2010 |
| WO | 2005099089 A1 | 10/2005 |
| WO | 2010/098139 | 2/2010 |

OTHER PUBLICATIONS

Yasutaka Shimizu (Tokyo Institute of Technology) and Yasushi Yamamoto (Nippon Electric Co., Ltd.), "A new Cut of quartz for SAW with more stable temperature characteristics" Mar. 26, 1982 (13 pages).

Takehiko Uno, Nobuhide Miyamoto and Hiroshi Abe (Electrical Communication Laboratories, NTT), "Fabrication of SAW Resonators with Groove Gratings and their Characteristics", (date—unknown) (pp. 45-52) with English translation.

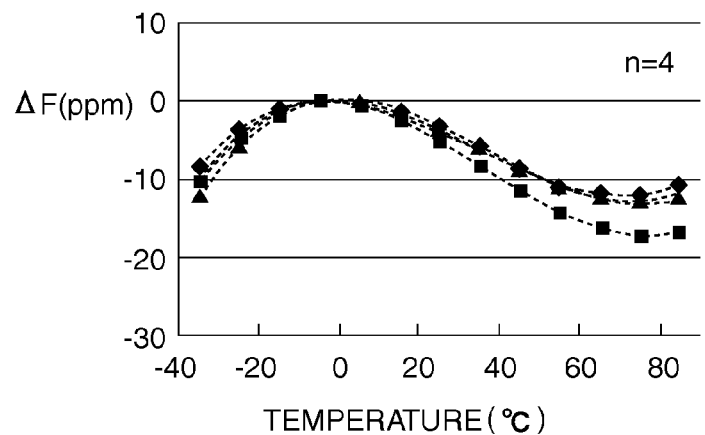
FIG. 35
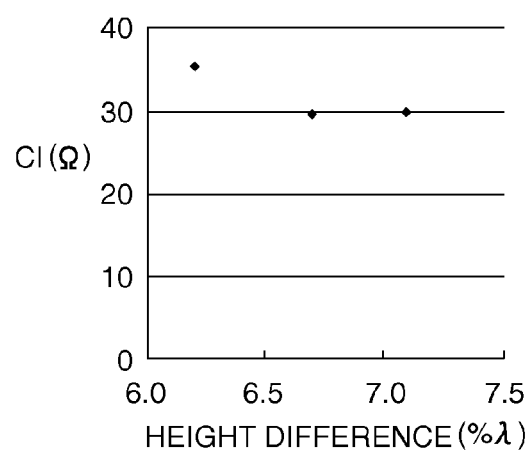
FIG. 36
|  | F | Q | γ | Cl | M |
|---|---|---|---|---|---|
|  | MHz |  |  | Ω |  |
| AVG | 318.25 | 13285 | 2476 | 21.8 | 5.4 |
FIG. 37

SURFACE ACOUSTIC WAVE DEVICE, SURFACE ACOUSTIC WAVE OSCILLATOR, AND ELECTRONIC APPARATUS

The entire disclosure of Japanese Patent Application No. 2010-189863, filed Aug. 26, 2010 is expressly incorporated by reference herein.

BACKGROUND

1. Technical Field

The present invention relates to a surface acoustic wave device, a surface acoustic wave oscillator having the surface acoustic wave device, and an electronic apparatus, and more particularly, to a surface acoustic wave device which has an excellent frequency temperature characteristic, a surface acoustic wave oscillator having the surface acoustic wave device, and an electronic apparatus.

2. Related Art

In a surface acoustic wave (SAW) device (such as an SAW resonator), variation in a frequency temperature characteristic is greatly affected by a stop band of the SAW or a cut angle of a quartz substrate, the shape of an IDT (Interdigital Transducer), and the like.

For example, JP-A-11-214958 discloses a configuration for exciting an upper mode and a lower mode of a stop band of an SAW, a standing wave distribution in the upper mode and the lower mode of the stop band, and the like.

JP-A-2006-148622, JP-A-2007-208871, JP-A-2007-267033, and JP-A-2002-100959 disclose that an upper mode of a stop band of an SAW has a frequency temperature characteristic more excellent than that in a lower mode of the stop band. JP-A-2006-148622 and JP-A-2007-208871 disclose that a cut angle of a quartz substrate is adjusted and a normalized thickness (H/λ) of an electrode is increased to about 0.1 so as to obtain an excellent frequency temperature characteristic in an SAW device using Rayleigh waves.

JP-A-2007-267033 discloses that a cut angle of a quartz substrate is adjusted and a normalized thickness (H/λ) of an electrode is increased to about 0.045 or greater in an SAW device using Rayleigh waves.

JP-A-2002-100959 discloses that a rotational Y-cut X-propagation quartz substrate is employed and that the frequency temperature characteristic is improved, compared with a case where resonance in a lower end of a stop band is used, by using resonance in an upper end of the stop band.

In an SAW device employing an ST-cut quartz substrate, grooves are disposed between electrode fingers of an IDT or between conductor strips of a reflector, which is disclosed in JP-A-57-5418 and "Manufacturing Conditions and Characteristics of Groove-type SAW Resonator", Technological Research Report of the Institute of Electronics and Communication Engineers of Japan MW82-59 (1982). The "Manufacturing Conditions and Characteristics of Groove type SAW Resonator" also discloses that a frequency temperature characteristic varies depending on the depth of the grooves.

Japanese Patent No. 3851336 discloses that a configuration for setting a curve representing a frequency temperature characteristic to a three dimensional curve is used in an SAW device employing an LST-cut quartz substrate and that any substrate with a cut angle having a temperature characteristic represented by a three dimensional curve could not be discovered in an SAW device employing Rayleigh waves.

As described above, there exist a variety of factors for improving the frequency temperature characteristic. Particularly, in the SAW device employing the Rayleigh waves, increase in the thickness of an electrode which forms an IDT is considered as one of factors contributing to the frequency temperature characteristic. However, the present inventor experimentally found out that an environment resistance characteristic such as a temporal variation characteristic or a temperature impact resistance characteristic is deteriorated by increasing the thickness of the electrode. Further, in a case where improvement in the frequency temperature characteristic is a main purpose, the thickness of the electrode should be increased as described above, and it is thus difficult to avoid the deterioration in the temporal variation characteristic, the temperature impact resistance characteristic or the like. This is true of a Q value, and thus, it is difficult to increase the Q value without increasing the thickness of the electrode.

SUMMARY

An advantage of some aspects of the invention is that it provides a surface acoustic wave device, a surface acoustic wave oscillator and an electronic apparatus which can realize an excellent frequency temperature characteristic.

APPLICATION EXAMPLE 1

This application example of the invention is directed to a surface acoustic wave device including an IDT which is disposed on a main plane of any one of a first quartz substrate with Euler angles of ($-60°\leq\phi\leq60°$, $1.7845\times10^{-9}\times|\phi|^6 + 2.2009\times10^{-17}\times|\phi|^5 - 1.1608\times10^{-5}\times|\phi|^4 - 4.6486\times10^{-13}\times|\phi|^3 + 1.8409\times10^{-2}\times|\phi|^2 - 3.1338\times10^{-9}\times|\phi| + 1.1803\times10^2 \leq \theta \leq 1.7845\times10^{-9}\times|\phi|^6 + 2.2009\times10^{-17}\times|\phi|^5 - 1.1608\times10^{-5}\times|\phi|^4 - 4.6486\times10^{-13}\times|\phi|^3 + 1.8409\times10^{-2}\times|\phi|^2 - 3.1338\times10^{-9}\times|\phi| + 1.4303\times10^2$, $2.5961\times10^{-9}\times|\phi|^6 + 1.2224\times10^{-17}\times|\phi|^5 - 1.6416\times10^{-5}\times|\phi|^4 - 3.2260\times10^{-13}\times|\phi|^3 + 2.5407\times10^{-2}\times|\phi|^2 - 1.2131\times10^{-9}\times|\phi| + 4.2235\times10 \leq \psi \leq 2.5961\times10^{-9}\times|\phi|^6 + 1.2224\times10^{-17}\times|\phi|^5 - 1.6416\times10^{-5}\times|\phi|^4 - 3.2260\times10^{-13}\times|\phi|^3 + 2.5407\times10^{-2}\times|\phi|^2 - 1.2131\times10^{-9}\times|\phi| + 4.9905\times10$), a second quartz substrate with Euler angles of ($-60°\leq\phi\leq60°$, $6.7778\times10^{-7}\times|\phi|^6 - 1.2200\times10^{-4}\times|\phi|^5 + 8.1111\times10^{-3}\times|\phi|^4 - 2.4133\times10^{-1}\times|\phi|^3 + 3.0521\times|\phi|^2 - 1.2247\times10\times|\phi| + 1.1700 \leq \theta \leq 6.7778\times10^{-7}\times|\phi|^6 - 1.2200\times10^{-4}\times|\phi|^5 + 8.1111\times10^{-3}\times|\phi|^4 - 2.4133\times10^{-1}\times|\phi|^3 + 3.0521\times|\phi|^2 - 1.2247\times10\times|\phi| + 1.4200$, $2.7816\times10^{-9}\times|\phi|^6 + 2.7322\times10^{-17}\times|\phi|^5 - 1.7524\times10^{-5}\times|\phi|^4 - 1.1334\times10^{-13}\times|\phi|^3 + 2.7035\times10^{-2}\times|\phi|^2 - 9.9045\times10^{-10}\times|\phi| + 1.3504\times10^2 \leq \psi \leq 2.7816\times10^{-9}\times|\phi|^6 + 2.7322\times10^{-17}\times|\phi|^5 - 1.7524\times10^{-5}\times|\phi|^4 - 1.1334\times10^{-13}\times|\phi|^3 + 2.7035\times10^{-2}\times|\phi|^2 - 9.9045\times10^{-10}\times|\phi| + 1.427\times10^2$), and a third quartz substrate with Euler angles of ($-60°\leq\phi\leq60°$, $-2.5000\times10^{-8}\times|\phi|^6 + 4.5000\times10^{-6}\times|\phi|^5 - 3.1667\times10^{-4}\times|\phi|^4 + 1.1000\times10^{-2}\times|\phi|^3 - 1.8308\times10^{-1}\times|\phi|^2 + 9.0500\times10^{-1}\times|\phi| + 3.2000\times10 \leq \theta \leq -2.5000\times10^{-8}\times|\phi|^6 + 4.5000\times10^{-6}\times|\phi|^5 - 3.1667\times10^{-4}\times|\phi|^4 + 1.1000\times10^{-2}\times|\phi|^3 - 1.8308\times10^{-1}\times|\phi|^2 + 9.0500\times10^{-1}\times|\phi| + 5.7000\times10$, $-4.3602\times10^{-9}\times|\phi|^6 - 1.2360\times10^{-17}\times|\phi|^5 + 2.7151\times10^{-5}\times|\phi|^4 + 3.2536\times10^{-14}\times|\phi|^3 - 4.1462\times10^{-2}\times|\phi|^2 - 9.4085\times10^{-10}\times|\phi| + 8.9090\times10 \leq \psi \leq -4.3602\times10^{-9}\times|\phi|^6 - 1.2360\times10^{-17}\times|\phi|^5 + 2.7151\times10^{-5}\times|\phi|^4 + 3.2536\times10^{-14}\times|\phi|^3 - 4.1462\times10^{-2}\times|\phi|^2 - 9.4085\times10^{-10}\times|\phi| + 9.6760\times10$), and which excites a surface acoustic wave in an upper mode of a stop band.

According to the surface acoustic wave resonator with this configuration, it is possible to achieve an excellent frequency temperature characteristic.

APPLICATION EXAMPLE 2

This application example of the invention is directed to the surface acoustic wave device according to Application Example 1, wherein an inter-electrode-finger groove is formed by recessing the substrate disposed between electrode fingers which form the IDT.

By forming the inter-electrode-finger groove, it is possible to suppress the thickness of the electrode film from being increased. Thus, it is possible to suppress the characteristic deterioration caused by the material which forms the electrode.

APPLICATION EXAMPLE 3

This application example of the invention is directed to the surface acoustic wave device according to Application Example 1 or 2, wherein when one of the first, second and third quartz substrates is used, a line occupancy η of the IDT satisfies the following expression:

$$0.49 \leq \eta \leq 0.70.$$

According to the surface acoustic wave device with this configuration, it is possible to maintain a secondary temperature coefficient β, which is a secondary coefficient in an approximate polynomial expression of a curve which indicates the frequency temperature characteristic of the surface acoustic wave device, in the range of β=±0.010 ppm/° C.$^2$.

APPLICATION EXAMPLE 4

This application example of the invention is directed to the surface acoustic wave device according to any one of Application Examples 1 to 3, wherein where the depth of the inter-electrode-finger groove is G, G satisfies the following expression:

$$0.02\lambda \leq G \leq 0.04\lambda.$$

When at least the depth G is in this range, it is possible to maintain the secondary temperature coefficient β in the range of β=±0.010 ppm/° C.$^2$.

APPLICATION EXAMPLE 5

This application example of the invention is directed to a surface acoustic waver oscillator which includes the surface acoustic wave device according to any one of Application Examples 1 to 4.

APPLICATION EXAMPLE 6

This application example of the invention is directed to an electronic apparatus which includes the surface acoustic wave device according to any one of Application Examples 1 to 4.

BRIEF DESCRIPTION OF THE DRAWINGS

The invention will be described with reference to the accompanying drawings, wherein like numbers reference like elements.

FIG. 35 is a diagram illustrating examples of frequency temperature characteristic data in four sample pieces under the condition that the frequency temperature characteristic is the best.

FIG. 36 is a graph illustrating the relationship between a height difference which is the sum of the depth of the inter-electrode-finger-groove and the electrode film thickness and a CI value.

FIG. 37 is a table illustrating examples of an equivalent circuit constant and a static characteristic in the SAW device according to the embodiment of the invention.

DESCRIPTION OF EXEMPLARY EMBODIMENTS

Hereinafter, a surface acoustic wave device, a surface acoustic wave oscillator, and an electronic apparatus according to embodiments of the invention will be described in detail with reference to the accompanying drawings.

Figure 1A:
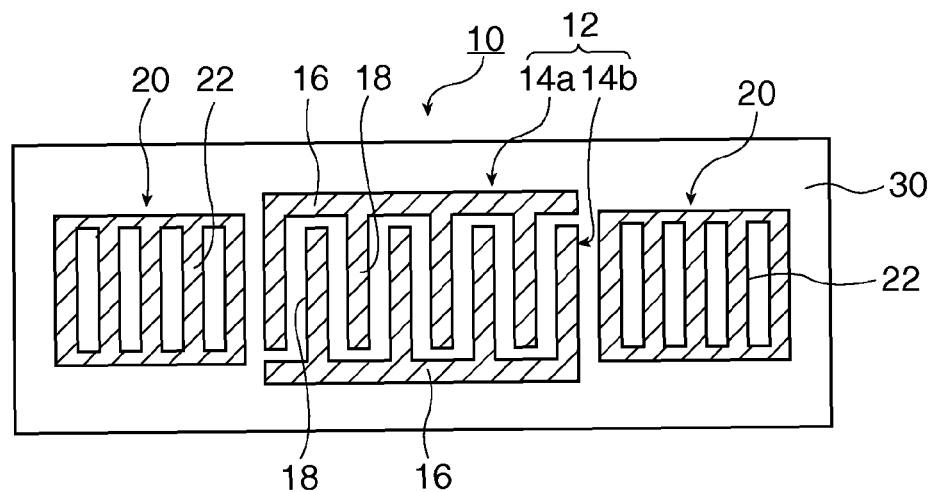
FIGS. 1A, 1B, and 1C are diagrams illustrating a configuration of an SAW device according to an embodiment of the invention.
Figure 1B:
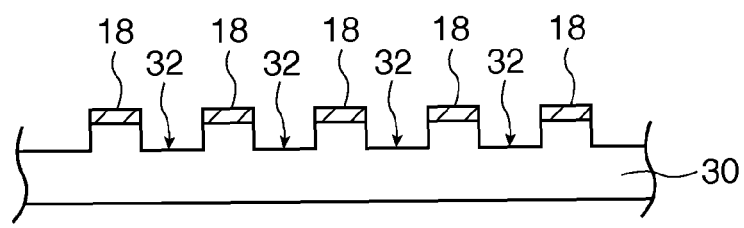
Figure 1C:
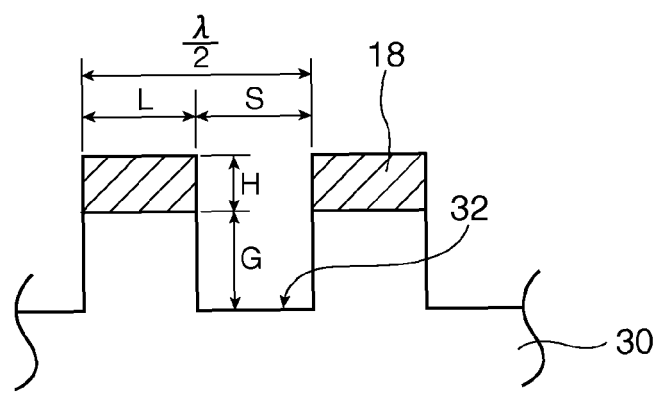

Firstly, a surface acoustic wave (SAW) device according to a first embodiment of the invention will be described with reference to FIGS. 1A, 1B, and 1C. FIG. 1A is a plan view of the SAW device, FIG. 1B is a partially enlarged sectional view of the SAW device when a groove is formed between electrode fingers, and FIG. 1C is an enlarged view illustrating the details of the SAW device in FIG. 1B.

The SAW device 10 according to this embodiment basically includes a quartz substrate 30 and an IDT 12. The SAW device 10 according to this embodiment is a resonator type in which reflectors 20 are arranged on the quartz substrate 30. Further, the quartz substrate 30 has crystal axes which are expressed by an X axis (electrical axis), a Y axis (mechanical axis), and a Z axis (optical axis). For definition of the quartz substrate 30 to be used, an Euler angle display is used. The Euler angles will be described now. A substrate with the Euler angles of (0°, 0°, 0°) is a Z-cut substrate having a main plane perpendicular to the Z axis. Here, φ of the Euler angles (φ, θ, ψ) is associated with a first rotation of the Z-cut substrate, and is a first rotation angle in which a rotating direction about the Z axis from the +X axis to the +Y axis is a positive rotating angle. The Euler angle θ is associated with a second rotation which is carried out after the first rotation of the Z-cut substrate, and is a second rotation angle in which a rotating direction about the X axis after the first rotation from the +Y axis after the first rotation to the +Z axis is a positive rotating angle. The cut plane of a piezoelectric substrate is determined by the first rotation angle θ and the second rotation angle θ. The Euler angle ψ is associated with a third rotation which is carried out after the second rotation of the Z-cut substrate, and is a third rotation angle in which a rotating direction about the Z axis after the second rotation from the +X axis after the second rotation to the +Y axis after the second rotation is a positive rotating angle. The propagation direction of the SAW is expressed by the third rotation angle ψ about the X axis after the second rotation.

Figure 2:
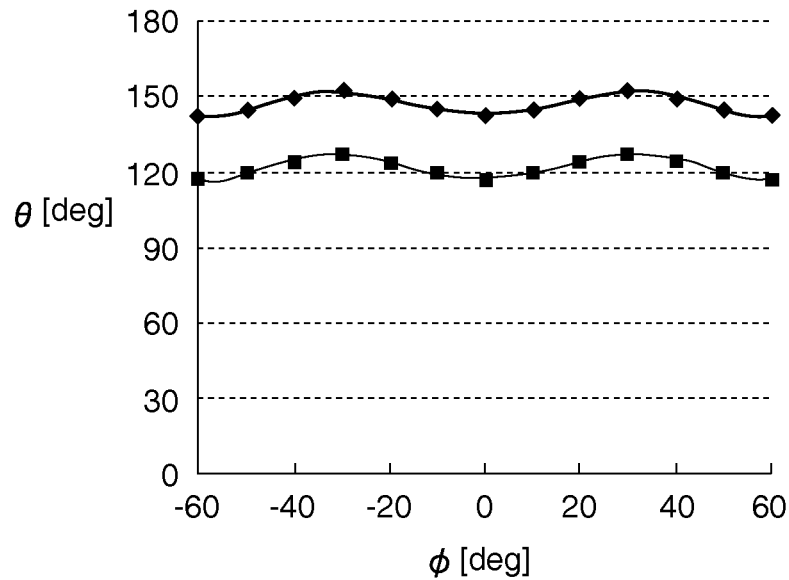
FIG. 2 shows a graph for determining Euler angles of a first quartz substrate, in which values of θ and ψ are plotted in which a secondary temperature coefficient is in the range of ±0.010 ppm/° C.$^2$, in the relationship with a first rotational angle φ.
Figure 2:
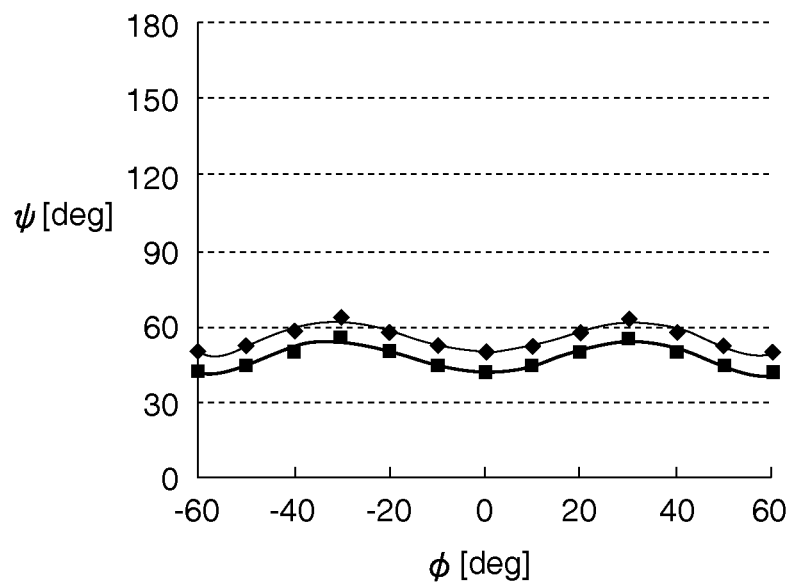
Figure 42:
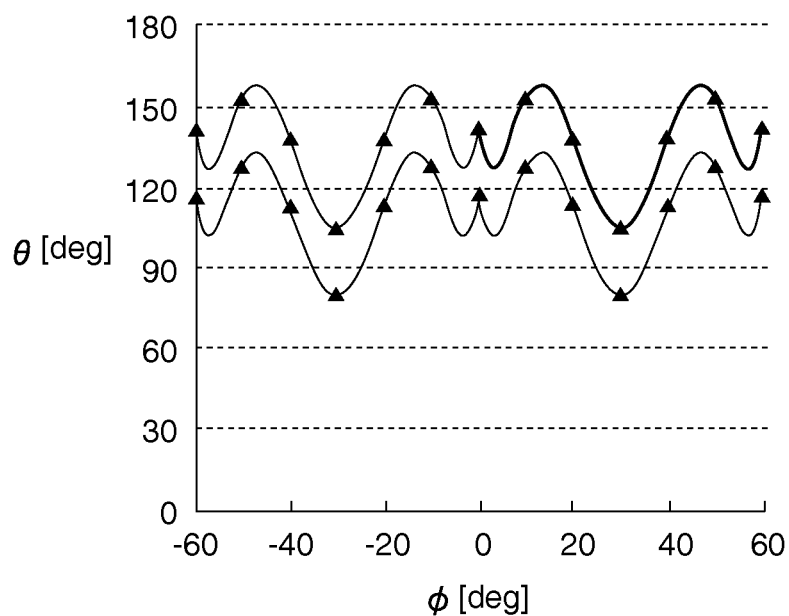
FIG. 42 shows a graph for determining Euler angles of a second quartz substrate, in which values of θ and ψ are plotted in which a secondary temperature coefficient is in the range of ±0.010 ppm/°$C^2$, in the relationship with a first rotational angle φ.
Figure 42:
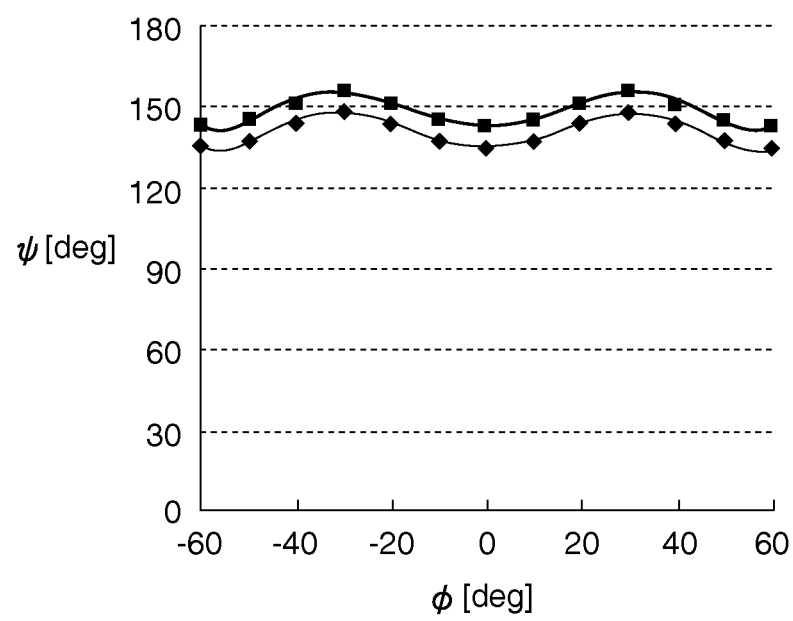
Figure 43:
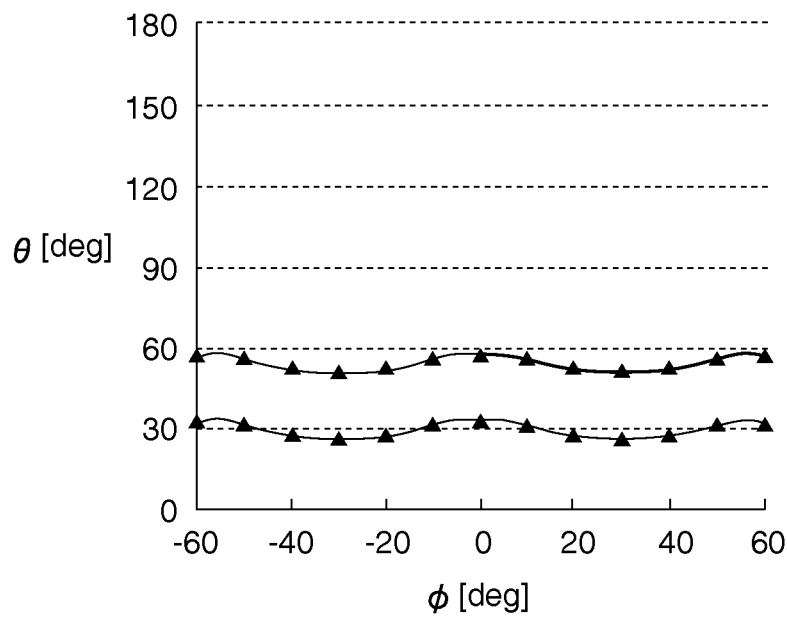
FIG. 43 shows a graph for determining Euler angles of a third quartz substrate, in which values of θ and ψ are plotted in which a secondary temperature coefficient is in the range of ±0.010 ppm/°$C^2$, in the relationship with a first rotational angle φ.
Figure 43:
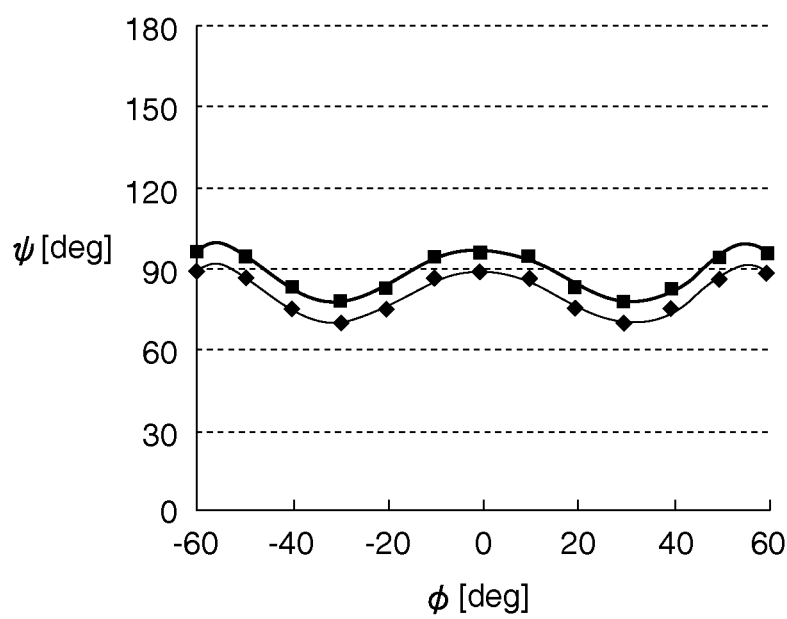

In the related art SAW device, it is known a cut angle in which the first rotational angle φ becomes a vicinity of 0° as a point where a secondary temperature coefficient becomes small. In this regard, the present applicant experimentally found out that there are three regions where the secondary temperature coefficient becomes small when the first rotational angle φ is changed in the cut angle of the quartz substrate. Further, by simulating ranges where the secondary temperature coefficient becomes excellent in the three regions when φ is changed in the ranges of −60° to +60°, it is possible to obtain graphs as shown in FIGS. 2, 42 and 43, respectively. In FIGS. 2, 42 and 43, upper graphs shows the relationship between the first rotational angle φ and the second rotational angle θ, and lower graphs shows the relationship between the first rotational angle φ and the third rotational angle ψ. Further, the ranges where the secondary temperature coefficient becomes excellent are regions where the secondary temperature coefficient β is in the range of β=±0.010 ppm/° C.$^2$. Since the secondary temperature coefficient β is a secondary coefficient in an approximate polynomial expression of a curve indicating a frequency temperature characteristic of an SAW, the fact that an absolute value of the secondary temperature coefficient is small means that the variation in the frequency is small, which means that the frequency temperature characteristic is excellent. In FIGS. 2, 42 and 43, the range of φ is set to the range of −60° to +60°, but may have the same repetitive inclination with respect to φ and ψ even in the range of φ=±120°, in view of objective properties of a quartz crystalline structure.

In the first embodiment, the SAW device is configured using a first quartz substrate which is defined in the range of data shown in FIG. 2 as the quartz substrate 30. When an approximate curve based on a polynomial expression is obtained on the basis of the plot in FIG. 2, the second rotational angle θ can be expressed as $1.7845 \times 10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.1803 \times 10^2 \leq \theta \leq 1.7845 \times 10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.4303 \times 10^2$, in the relationship with the first rotational angle φ. Further, the third rotational angle ψ can be expressed as $2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.2235 \times 10 \leq \psi \leq 2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.9905 \times 10$, in the relationship with the first rotational angle φ. Accordingly, the Euler angles of the first quartz substrate are determined to be in the range of (−60°≤φ≤60°, $1.7845 \times 10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.1803 \times 10^2 \leq \theta \leq 1.7845 \times 10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.4303 \times 10^2$, $2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.2235 \times 10 \leq \theta \leq 2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.9905 \times 10$).

The IDT 12 includes a pair of pectinate electrodes 14a and 14b in which the base end portions of plural electrode fingers 18 are connected to each other by a bus bar 16. The electrode fingers 18 of one pectinate electrode 14a (or 14b) and the electrode fingers 18 of the other pectinate electrode 14b (or 14a) are alternately arranged with a predetermined gap therebetween. Here, the electrode fingers 18 are arranged in a direction perpendicular to the X' axis in which the surface acoustic wave is propagated. The SAW excited by the SAW device 10 having the above-mentioned configuration is a Rayleigh type SAW and has a vibration displacement component in both the Z axis after the third rotation and the X axis after the third rotation. In this way, by deviating the propagation direction of the SAW from the X axis which is the crystal axis of quartz, it is possible to excite the SAW in the upper mode of the stop band.

Figure 3:
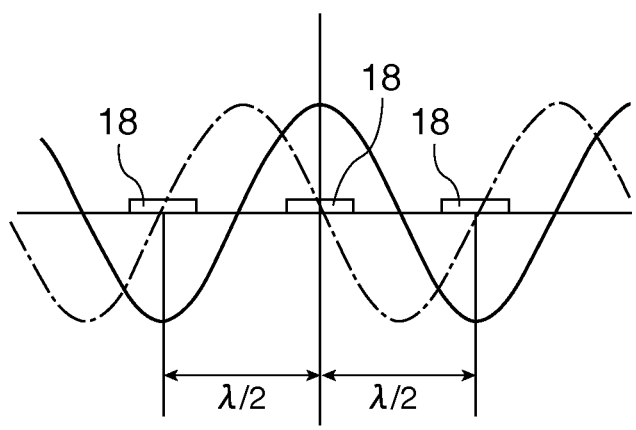
FIG. 3 shows a graph illustrating the relationship between an upper mode of a stop band and a lower mode thereof.

The SAW in the upper mode of the stop band and the SAW in the lower mode of the stop band will be described now. In the SAWs in the upper mode and the lower mode of the stop band formed by the regular IDT 12 shown in FIG. 3 (where the electrode fingers 18 of the IDT 12 are shown in FIG. 3), the standing waves are deviated in antinode (or node) positions by π/2 from each other. FIG. 3 is a diagram illustrating a standing wave distribution in the upper mode and the lower mode of the stop band in the regular IDT 12.

In FIG. 3, as described above, the standing wave in the lower mode of the stop band indicated by a solid line has an antinode at the center position of each electrode finger 18, that is, at the reflection center position, and the standing wave in the upper mode of the stop band indicated by a one-dot chained line has a node at the reflection center position.

Further, a pair of reflectors 20 is disposed so as to interpose the IDT 12 in the propagation direction of the SAW. Specifically, both ends of plural conductor strips 22 disposed parallel to the electrode fingers 18 of the IDT 12 are connected to each other.

An end-reflecting SAW device actively using a reflected wave from an end surface in the SAW propagation direction of the quartz substrate or a multi-pair IDT-type SAW device exciting a standing wave of an SAW using only the IDT by increasing the number of electrode finger pairs of the IDT does not necessarily require the reflector.

In this embodiment, a minimum value of the secondary temperature coefficient β is selected, in which an electrode film thickness H which forms the IDT 12 is 0.06λ (λ is wavelength) and a line occupancy η which is a ratio between the width of the electrode finger 18 and the width between the electrode fingers is in the range of 0.49≤η≤0.70.

Figure 4:
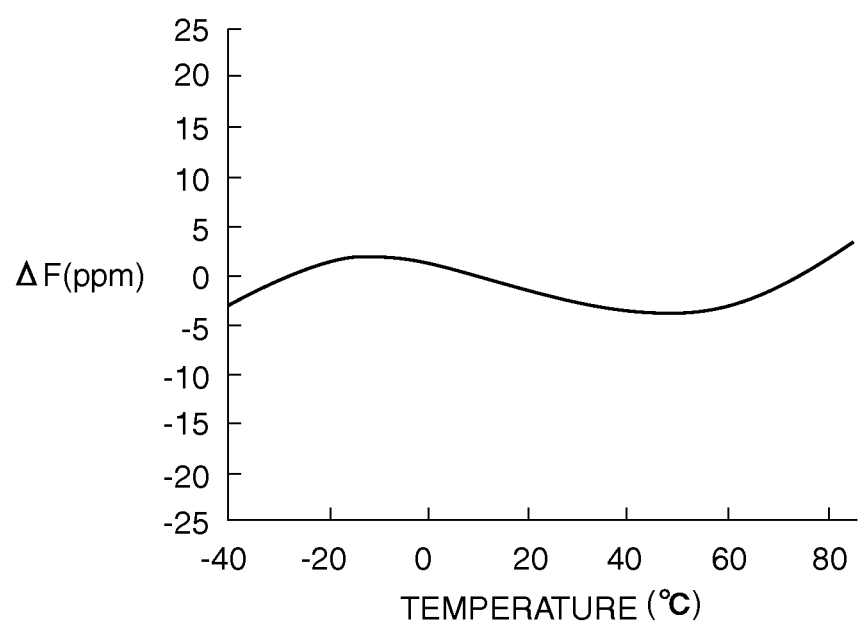
FIG. 4 shows a graph illustrating a frequency temperature characteristic in an SAW device when an electrode film thickness H is 0.06λ, a line occupancy η is 0.49, and Euler angles are (20°, 134°, 51.2°).

In the SAW device with such a configuration, since the secondary temperature coefficient β is in the range of β=±0.010 ppm/° C.$^2$, it is possible to achieve an excellent frequency temperature characteristic. For example, the frequency temperature characteristic when the electrode film thickness H is 0.06λ, the line occupancy η is 0.49, and the Euler angles are (20°, 134°, 51.2°) is as shown in a graph in FIG. 4. The secondary coefficient (secondary temperature coefficient β) in an approximate polynomial expression shown in FIG. 4 is 0.0004 ppm/° C.$^2$, which means that the secondary temperature coefficient β becomes remarkably small and thus the frequency temperature characteristic is excellent.

The electrode films which forms the IDT 12 or the reflectors 20 having the above-mentioned configuration may be formed of aluminum (Al) or alloy containing Al as a main component, for example. When the alloy is used as the material of the electrode films, metal other than Al as a main component may be contained at 10% or less in terms of the weight. Further, since the regions where the secondary temperature coefficient becomes excellent as shown in FIGS. 2, 42 and 43 is related to the characteristic of the quartz substrate 30, but is not related to the material of the electrode film.

Figure 5:
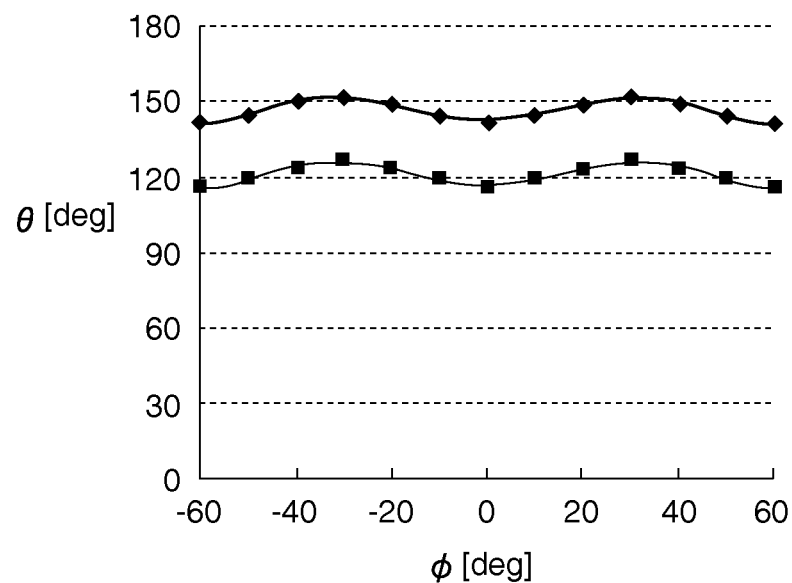
FIG. 5 shows a graph in which values of θ and ψ are plotted in which a secondary temperature coefficient is in the range of ±0.010 ppm/° C.$^2$, in the relationship with a first rotational angle φ, when grooves are formed in the first quartz substrate.
Figure 5:
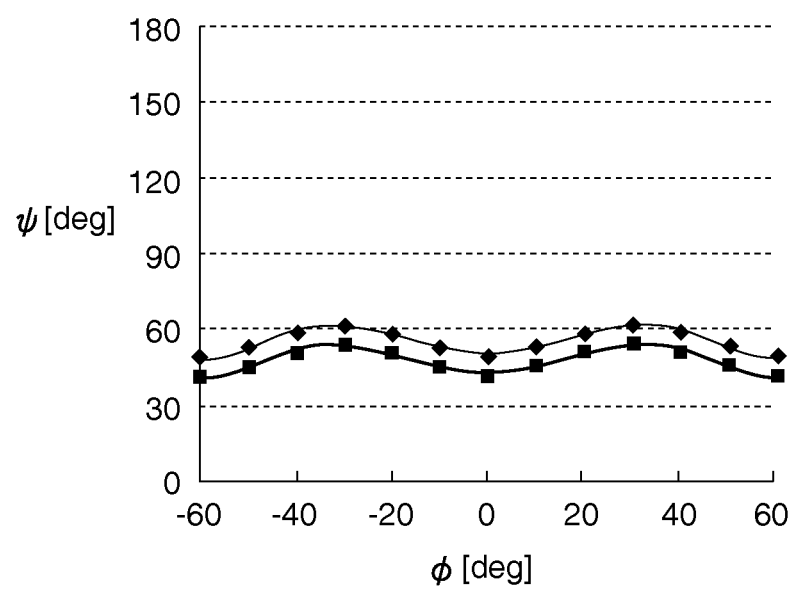

In the quartz substrate 30 of the SAW device 10 having the basic configuration described above, grooves (inter-electrode-finger grooves) 32 may be formed between the electrode fingers of the IDT 12 or the conductor strips of the reflectors 20. Graphs shown in FIG. 5 illustrate regions of the second rotational angle θ and the third rotational angle ψ in which the secondary temperature coefficient β is in the range of β=±0.010 ppm/° C.², even when the first rotational angle φ is changed, when the above first quartz substrate is used, the electrode film thickness H is 0.02λ, the groove depth G is 0.04λ, and η is in the range of 0.42≦η≦0.70. It can be seen from FIG. 5 that the excellent frequency temperature characteristic can be obtained even when the grooves 32 are formed between the electrode fingers. Even when the groove depth G is changed, the second temperature coefficients β can be respectively obtained in the range of β=±0.010 ppm/° C.², as described below.

First Embodiment
 H: 0.02λ
 G: 0.03λ
 Euler angles: (10°, 130°, 47.4°)
 β: −0.001
Second Embodiment
 H: 0.02λ
 G: 0.02λ
 Euler angles: (20°, 134°, 53.0°)
 β: −0.005
Third Embodiment
 H: 0.02λ
 G: 0.03λ
 Euler angles: (30°, 137°, 56.5°)
 β: 0.008

Figure 6:
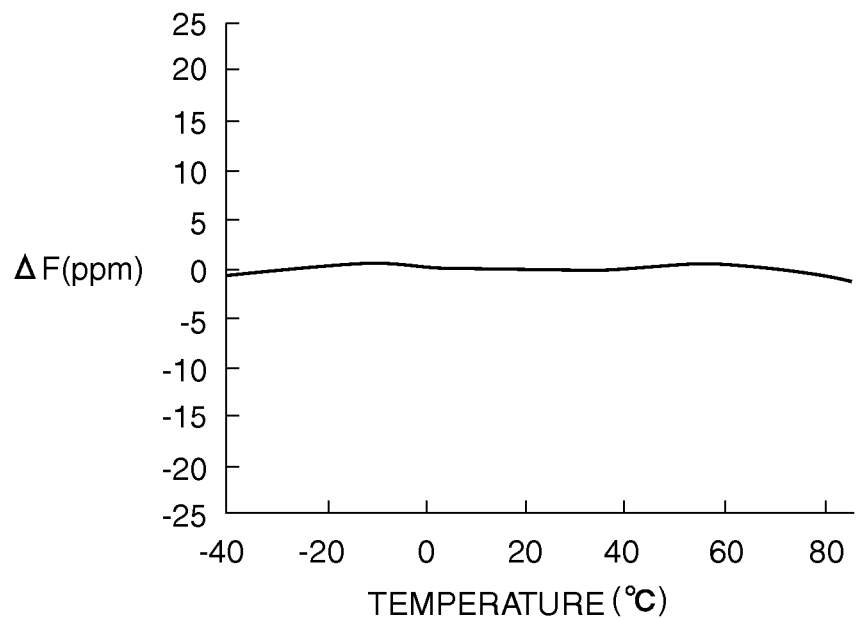
FIG. 6 shows a graph illustrating a frequency temperature characteristic in an SAW device when an electrode film thickness H is 0.02λ, a groove depth G is 0.04λ, a line occupancy η is 0.42, and Euler angles are (30°, 137°, 55.9°).

It can be inferred from these results that the excellent frequency temperature characteristic can be obtained even when the groove depth G is changed. For example, the frequency temperature characteristic when the electrode film thickness H is 0.02λ, the groove depth G is 0.04λ, the line occupancy η is 0.42, and the Euler angles are (30°, 137°, 55.9°) is as shown in a graph in FIG. 6. The secondary coefficient (secondary temperature coefficient β) in an approximate polynomial expression shown in FIG. 6 is 0.0009 ppm/° C.². In this case, an approximate curve indicating the frequency temperature characteristic becomes approximately horizontal, which shows that the frequency temperature characteristic is excellent.

Hereinafter, description will be made to detailed characteristics in a state where the ranges of the Euler angles of the quartz substrate are further limited. The limiting condition is that the Euler angles of the first quartz substrate are (−1°≦φ≦1°, 117°≦θ≦142°, 41.9°≦|ψ|≦49.57°. When the Euler angles of the quartz substrate 30 are limited as above, the grooves 32 formed between the electrode fingers may have the groove depth G which satisfies the following expression (1).

$$0.01\lambda \leq G \quad (1)$$

Figure 7:
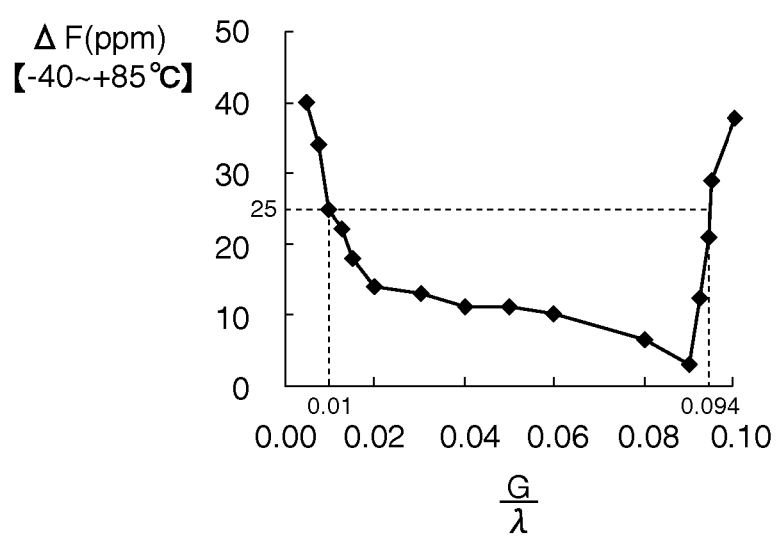
FIG. 7 is a graph illustrating the relationship between the depth of an inter-electrode-finger groove and a frequency variation in an operating temperature range.

When the upper limit of the groove depth G is set, as can be seen from FIG. 7, it is preferred that the groove depth is set in the range as expressed by the following expression (2).

$$0.01\lambda \leq G \leq 0.094\lambda \quad (2)$$

By setting the groove depth G to this range, the frequency variation in the operating temperature range (−40° C. to +85° C.) can be suppressed to 25 ppm or less as a target value, the details of which will be described later. The groove depth G may be preferably set to satisfy the following expression (3).

$$0.01\lambda \leq G \leq 0.0695\lambda \quad (3)$$

By setting the groove depth G to this range, the shift quantity of the resonance frequency between the individual SAW devices 10 can be suppressed to a correction range even when a production tolerance occurs in the groove depth G.

Further, the line occupancy η is a value obtained by dividing a line width L of each electrode finger 18 (the width of a convex portion when a quartz convex portion is formed) by a pitch λ/2 (=L+S) between the electrode fingers 18, as shown in FIG. 1C. Therefore, the line occupancy η can be expressed by the following expression (4).

$$\eta = L/(L+S) \quad (4)$$

In the SAW device 10 according to this embodiment, the line occupancy η can be determined in the range expressed by the following expression (5). As can be seen from the following expression (5), η can be derived by determining the depth G of the grooves 32.

$$-2.5 \times \frac{G}{\lambda} + 0.675 \leq \eta \leq -2.5 \times \frac{G}{\lambda} + 0.775 \quad (5)$$

Further, it is preferred that the thickness of the electrode film material (of the IDT 12, the reflectors 20 or the like) in the SAW device 10 according to this embodiment be set in a range of the following expression (6).

$$0 < H \leq 0.035\lambda \quad (6)$$

Further, in consideration of the electrode film thickness expressed by Expression (6), the line occupancy η can be calculated by the following expression (7).

$$\eta = -2.533 \times \frac{G}{\lambda} - 2.269 \times \frac{H}{\lambda} + 0.785 \quad (7)$$

As for the line occupancy η, the production tolerance of the electrical characteristic (particularly, the resonance frequency) increases as the electrode film thickness increases. Accordingly, there is a high possibility that a production tolerance of ±0.04 or less occurs when the electrode film thickness H is in the range expressed by the expression (6) and a production tolerance greater than ±0.04 occurs when the electrode film thickness is in the range of H>0.035λ. However, when the electrode film thickness H is in the range expressed by the expression (6) and the tolerance of the line occupancy η is ±0.04 or less, it is possible to embody an SAW device with a small secondary temperature coefficient β. That is, the line occupancy η can be extended to the range expressed by the following expression (8) which is obtained by adding the tolerance of ±0.04 to the expression (7).

$$\eta = -2.533 \times \frac{G}{\lambda} - 2.269 \times \frac{H}{\lambda} + 0.785 \pm 0.04 \quad (8)$$

In the SAW device 10 according to this embodiment having the above-mentioned configuration, when the secondary temperature coefficient β is within the range of ±0.010 ppm/° C.² and the operating temperature range of the SAW is preferably set to −40° C. to +85° C., it is a goal to improve the frequency temperature characteristic until the frequency variation ΔF in the operating temperature range is 25 ppm or less. Hereinafter, it is proved by simulation that the SAW device having the above-mentioned configuration has factors for accomplishing the advantage of the invention.

In the SAW device whose propagation direction is the direction of the crystal X axis using a quartz substrate called an ST cut, when the operating temperature range is constant, the frequency variation ΔF in the operating temperature range is about 117 ppm and the secondary temperature coefficient β is about −0.030 ppm/° C.². Further, in the SAW device which is formed using an in-plane rotation ST-cut quartz substrate in which the cut angle of the quartz substrate and the SAW propagation direction are expressed by Euler angles (0°, 123°, 45°) and the operating temperature range is the same, the frequency variation ΔF is about 63 ppm and the secondary temperature coefficient β is about −0.016 ppm/° C.².

As described above, the variation in the frequency temperature characteristic of the SAW device 10 is affected by the line occupancy η of the electrode fingers 18 or the electrode film thickness H of the IDT 12 and the groove depth G. The SAW device 10 according to this embodiment employs the excitation in the upper mode of the stop band.

Figure 8A:
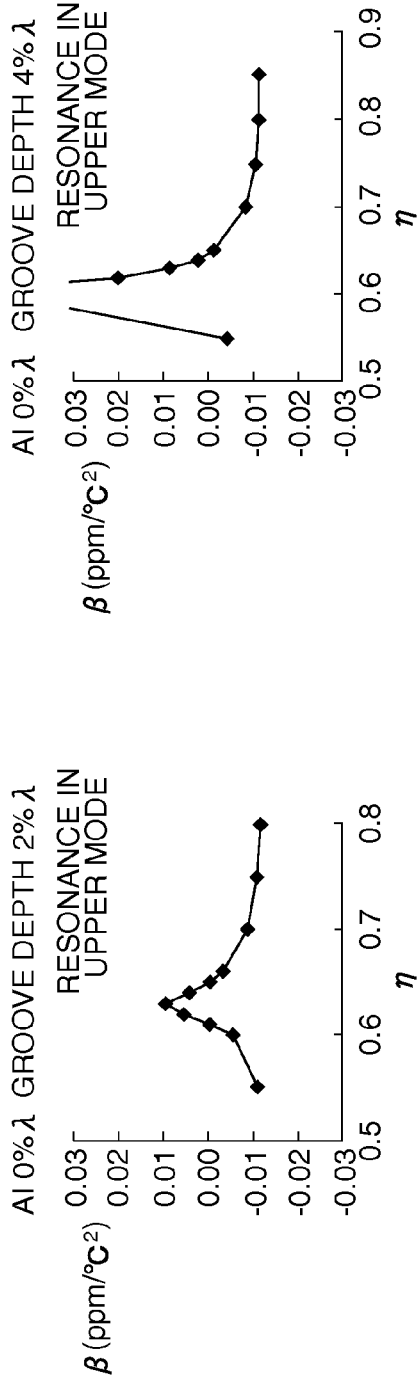
FIGS. 8A to 8D are graphs illustrating a difference in a secondary temperature coefficient due to a variation in a line occupancy η between a resonance point in the upper mode of the stop band and a resonance point in the lower mode of the stop band.
Figure 8B:
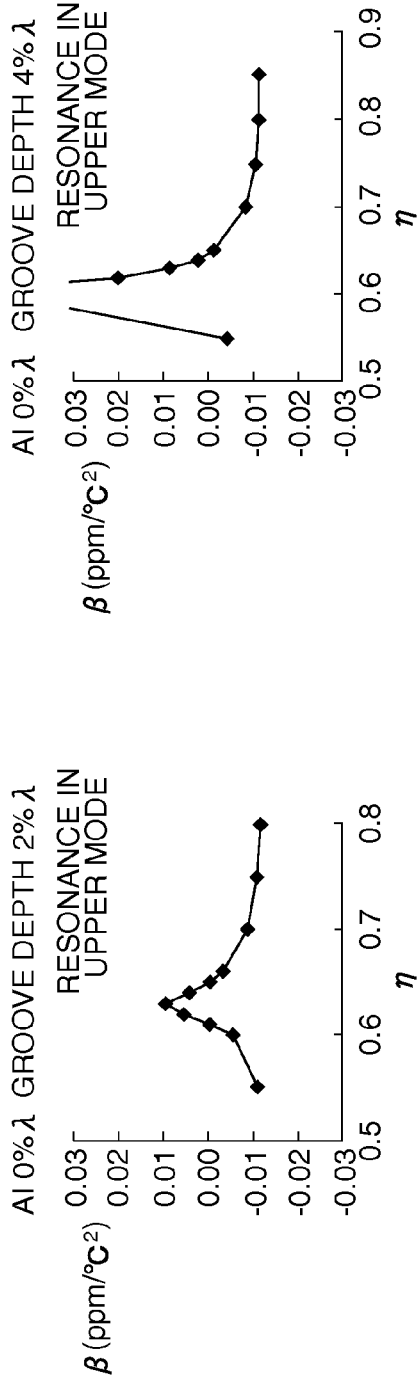
Figure 8C:
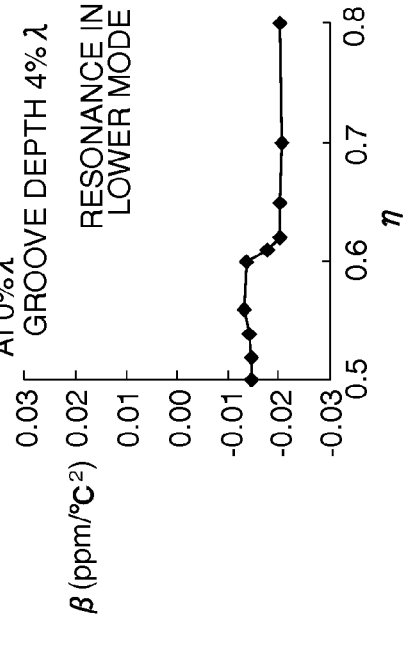
Figure 8D:
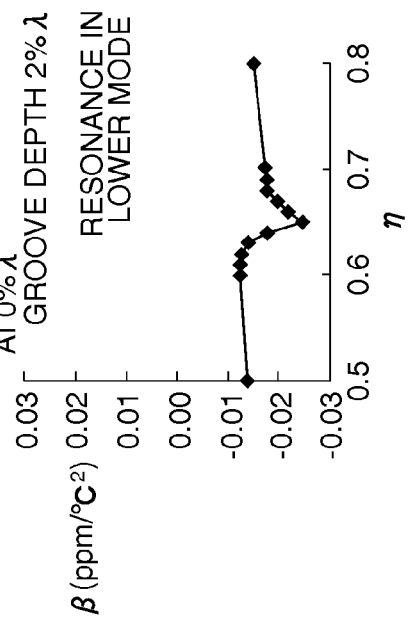

FIGS. 8A to 8D are graphs illustrating the variation of the secondary temperature coefficient β when the line occupancy η is varied and the SAW is propagated by the quartz substrate 30. FIG. 8A shows the secondary temperature coefficient β in the resonance in the upper mode of the stop band when the groove depth G is 0.02λ, and FIG. 8B shows the secondary temperature coefficient β in the resonance in the lower mode of the stop band when the groove depth G is 0.02λ. Further, FIG. 8C shows the secondary temperature coefficient β in the resonance in the upper mode of the stop band when the groove depth G is 0.04λ, and FIG. 8D shows the secondary temperature coefficient β in the resonance in the lower mode of the stop band when the groove depth G is 0.04λ. In the simulation shown in FIGS. 8A to 8D, the SAW is propagated in some way by the quartz substrate 30 which is not provided with an electrode film so as to reduce the factor varying the frequency temperature characteristic. Further, the Euler angles (0°, 123°, ψ) are used as the cut angle of the quartz substrate 30. A value at which the absolute value of the secondary temperature coefficient β is the minimum is properly selected as ψ.

It can be seen from FIGS. 8A to 8D that the secondary temperature coefficient β greatly varies in the vicinity of the line occupancy η of 0.6 to 0.7 in the upper mode and the lower mode of the stop band. By comparing the variation of the secondary temperature coefficient β in the lower mode of the stop band with the variation of the secondary temperature coefficient β in the upper mode of the stop band, it is possible to conclude the following. That is, when the variation of the secondary temperature coefficient β in the lower mode of the stop band is shifted from a minus side to a greater minus side, the characteristic is deteriorated (the absolute value of the secondary temperature coefficient β increases). On the other hand, when the variation of the secondary temperature coefficient β in the upper mode of the stop band is shifted from the minus side to a plus side, the characteristic is improved (the absolute value of the secondary temperature coefficient β decreases).

Accordingly, in order to obtain the excellent frequency temperature characteristic in the SAW device, it is preferable to use the vibration in the upper mode of the stop band.

The inventor made a study of the relationship between the line occupancy η and the secondary temperature coefficient β when the SAW in the upper mode of the stop band is propagated in the quartz substrate with various groove depths G.

Figure 9:
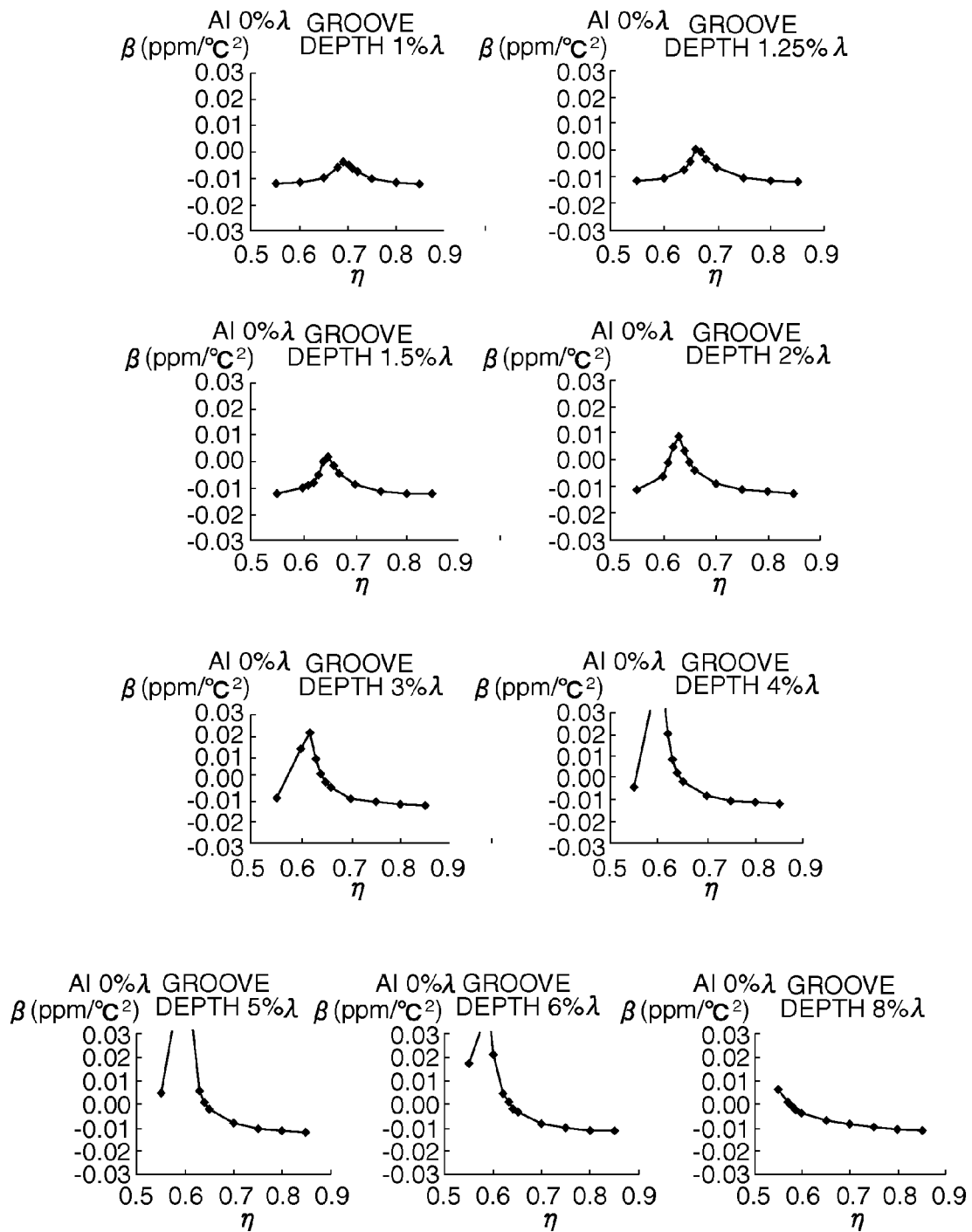
FIG. 9 shows graphs illustrating the relationship between the line occupancy η and the secondary temperature coefficient β when the depth of the inter-electrode-finger groove is changed with an electrode film thickness of 0.

FIG. 9 shows simulation graphs illustrating the relationships between the line occupancy η and the secondary temperature coefficient β when the groove depth G is varied from 0.01λ (1% λ) to 0.08λ (8% λ). It can be seen from FIG. 9 that a point with β=0, that is, a point where an approximate curve representing the frequency temperature characteristic is a cubic curve, starts to appear in the vicinity of the groove depth G of 0.0125λ (1.25% λ). It can be also seen from FIG. 9 that there are two points η with β=0 (a point η1) with β=0 on the side where η is great and a point η2) with β=0 on the side where η is small). It can be also seen from FIG. 9 that η2 is greater than η1 in the variation of the line occupancy η with respect to the variation of the groove depth G.

Figure 10:
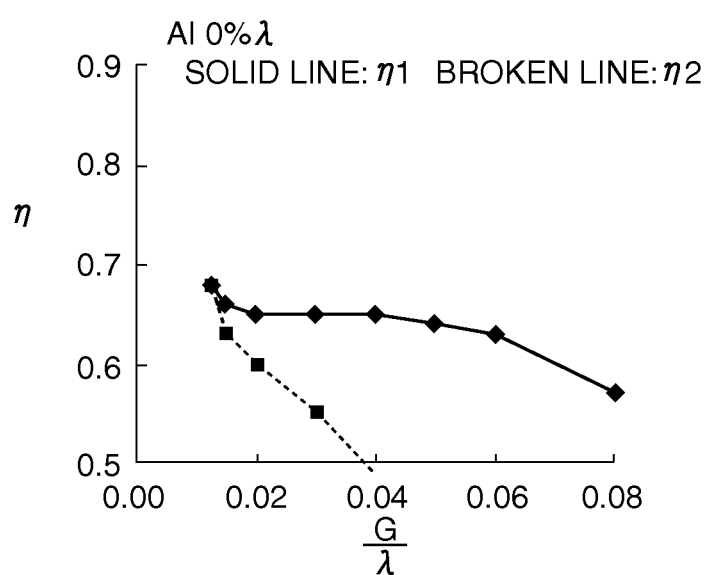
FIG. 10 shows a graph illustrating the relationship between the depth of the inter-electrode-finger groove and the line occupancy η in which the secondary temperature coefficient is 0 with the electrode film thickness of 0.

This knowledge can be understood more deeply with reference to FIG. 10. FIG. 10 is a graph in which η1 and η2 are plotted in which the secondary temperature coefficient β is 0 while changing the groove depth G. It can be seen from FIG. 10 that η1 and η2 decrease as the groove depth G increases, but the variation of η2 is great in the vicinity of the groove depth of G=0.04λ to such an extent that the variation departs from the graph expressed in the range of 0.5λ to 0.9λ. That is, variation of the η2 is great with respect to the variation of the groove depth G.

Figure 11:
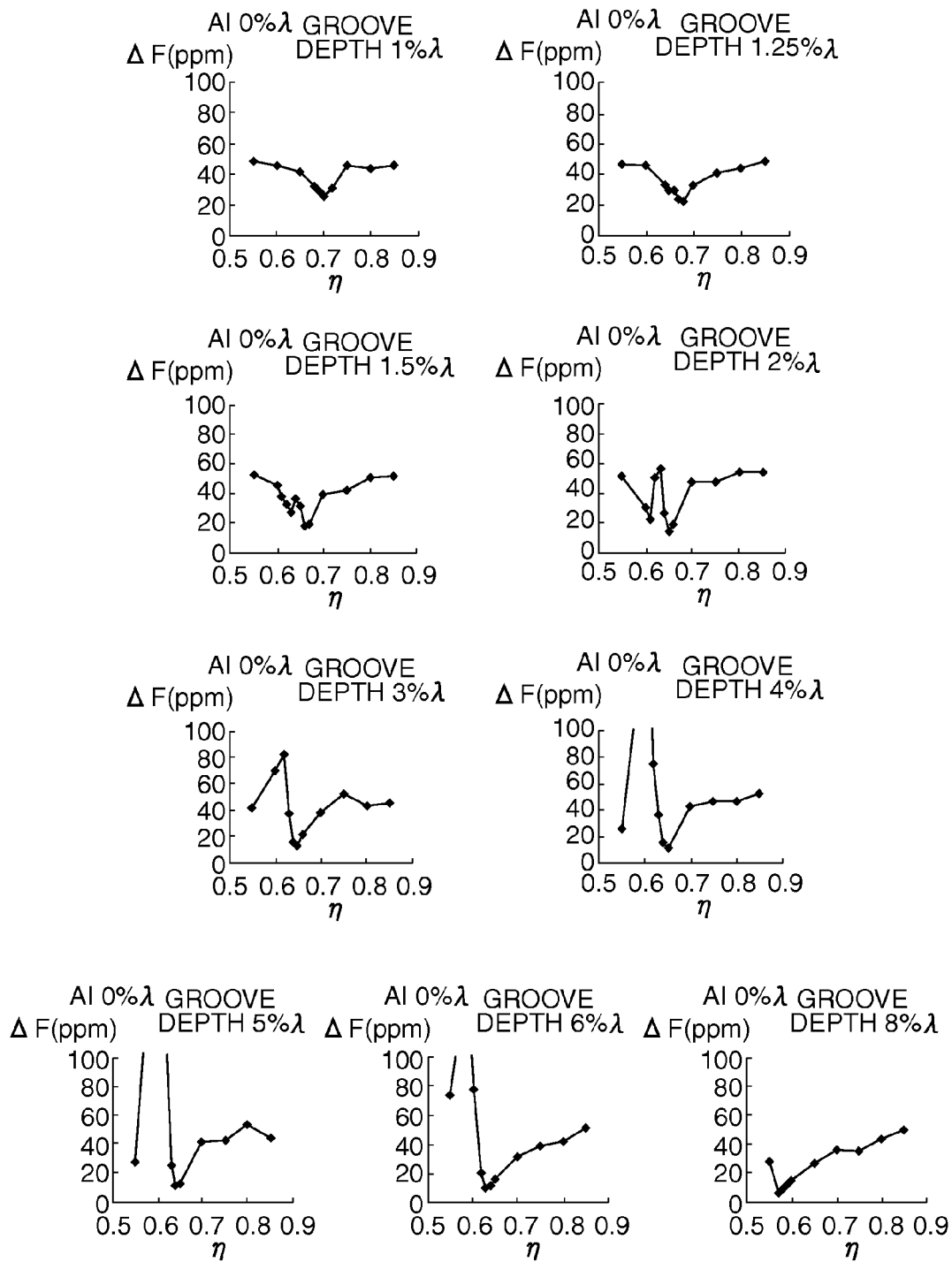
FIG. 11 shows graphs illustrating the relationship between the line occupancy η and the frequency variation ΔF when the depth of the inter-electrode-finger groove is changed with an electrode film thickness of 0.

FIG. 11 shows graphs in which the vertical axis of FIG. 9 is changed from the secondary temperature coefficient β to the frequency variation ΔF. It can be seen from FIG. 11 that the frequency variation ΔF is lowered at two points η1 and η2) with β=0. It can be also seen from FIG. 11 that the frequency variation ΔF is suppressed to be small at a point corresponding to η1 in any graph with the changed groove depth G out of two points with β=0.

According to this tendency, it is preferable for mass products in which production errors can be easily caused that the line occupancy with a small variation of the point with β=0 relative to the variation of the groove depth G be employed, that is, that η1 be employed. FIG. 7 shows a graph illustrating the relationship between the frequency variation ΔF at the point η1) in which the secondary temperature coefficient β is the minimum in each groove depth G and the groove depth G. It can be seen from FIG. 7 that the lower limit of the groove depth G in which the frequency variation ΔF is equal to or less than 25 ppm as a target value is 0.01λ and the groove depth G is equal to or greater than the lower limit, that is, the range of the groove depth G is 0.01λ≦G.

In FIG. 7, an example where the groove depth G is equal to or greater than 0.08λ in simulation is also shown. In the simulation, the groove depth G is equal to or greater than 0.01λ, the frequency variation ΔF is equal to or less than 25 ppm, and then the frequency variation ΔF decreases as the groove depth G increases. However, when the groove depth G is equal to or greater than 0.09λ, the frequency variation ΔF increases again. When the groove depth G is greater than 0.094λ, the frequency variation ΔF becomes greater than 25 ppm.

The graph shown in FIG. 7 is the simulation in a state where the electrode films such as the IDT 12 and the reflectors 20 are not formed on the quartz substrate 30, but it can be understood that the frequency variation ΔF of the SAW device 10 having the electrode films formed thereon is smaller, and the details of which can be seen from FIGS. 20 to 25. Accordingly, when the upper limit of the groove depth G is determined, the maximum value in a state where the electrode films are not formed may be set to G≦0.094λ. The range of the groove depth G suitable for accomplishing the goal can be expressed by the following expression (9).

$$0.01\lambda \leq G \leq 0.094\lambda \tag{9}$$

Figure 12:
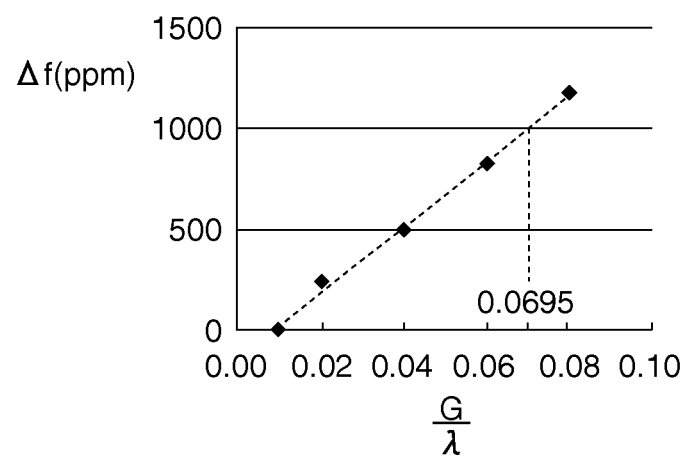
FIG. 12 is a graph illustrating the relationship between the depth of the specific inter-electrode-finger groove when the depth of the inter-electrode-finger groove is deviated by ±0.001λ and a frequency difference generated in the SAW device according to the deviation.

The groove depth G in the mass production has a maximum tolerance of about ±0.001λ. Accordingly, when the line occupancy η is constant and the groove depth G is deviated by ±0.001λ, the frequency variation Δf of each SAW device 10 is as shown in FIG. 12. It can be seen from FIG. 12 that when the groove depth G is deviated by ±0.001λ in G=0.04λ, that is, when the groove depth is in the range of 0.039λ≦G≦0.041λ, the frequency variation Δf is about ±500 ppm.

Here, when the frequency variation Δf is less than ±1000 ppm, the frequency can be adjusted using various means for finely adjusting the frequency. However, when the frequency variation Δf is equal to or greater than ±1000 ppm, the static characteristic such as a Q value and CI (Crystal Impedance) value and the long-term reliability are affected by the frequency adjustment, and thus, the good production rate of the SAW device 10 is deteriorated.

By deriving an approximate expression representing the relationship between the frequency variation Δf [ppm] and the groove depth G from the straight line connecting the plots shown in FIG. 12, the following expression (10) can be obtained.

$$\Delta f = 16334G - 137 \tag{10}$$

Here, the range of G satisfying Δf<1000 ppm is $G \leq 0.0695\lambda$. Accordingly, the range of the groove depth G according to this embodiment is preferably expressed by the following expression (11).

$$0.01\lambda \leq G \leq 0.0695\lambda \tag{11}$$

Figure 13:
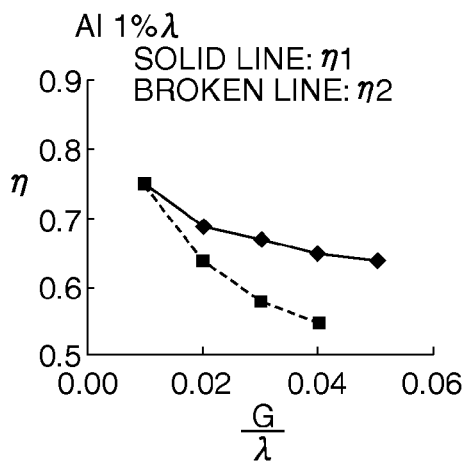
FIG. 13 shows graphs illustrating the relationship between the depth of the inter-electrode-finger groove and the line occupancy η in which the secondary temperature coefficient is 0 when the electrode film thickness is changed.
Figure 13:
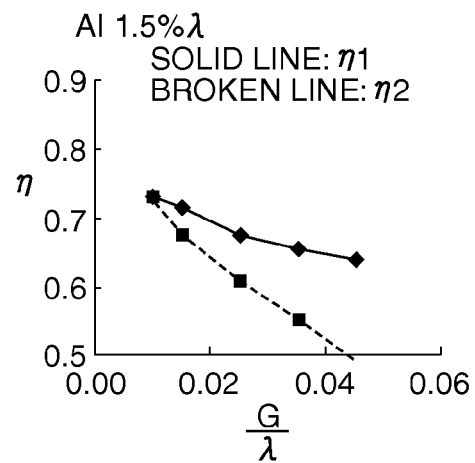
Figure 13:
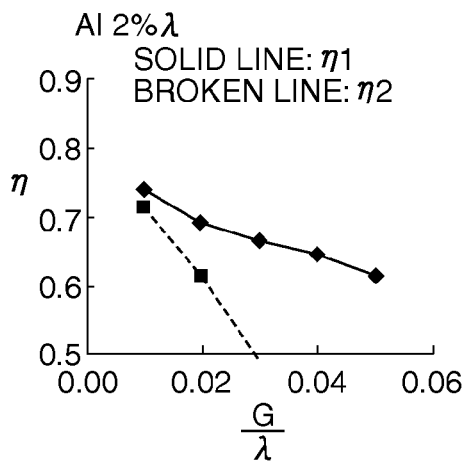
Figure 13:
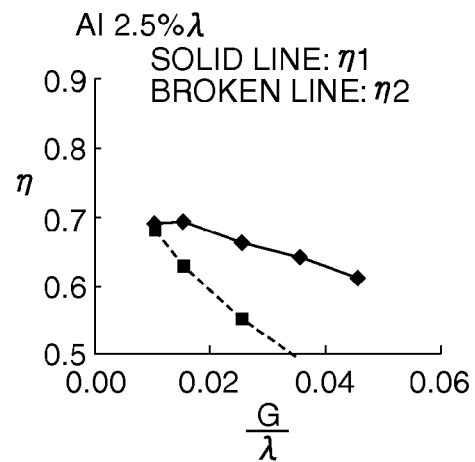
Figure 13:
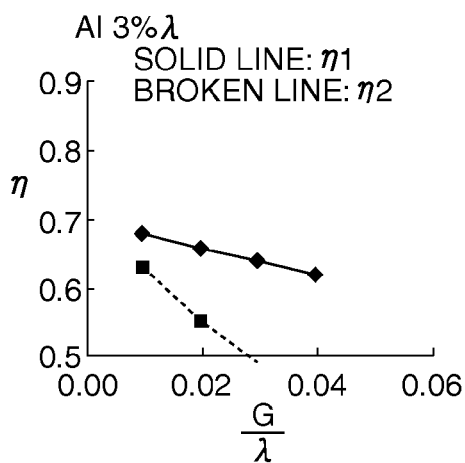
Figure 13:
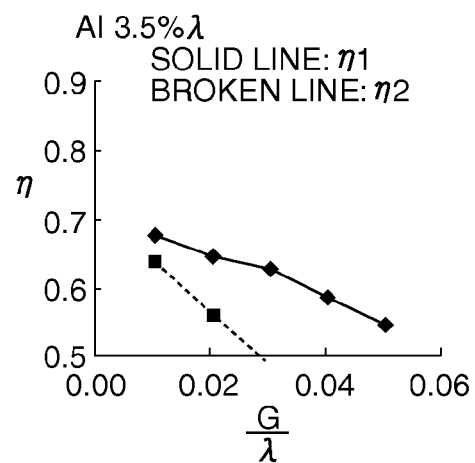
Figure 28:
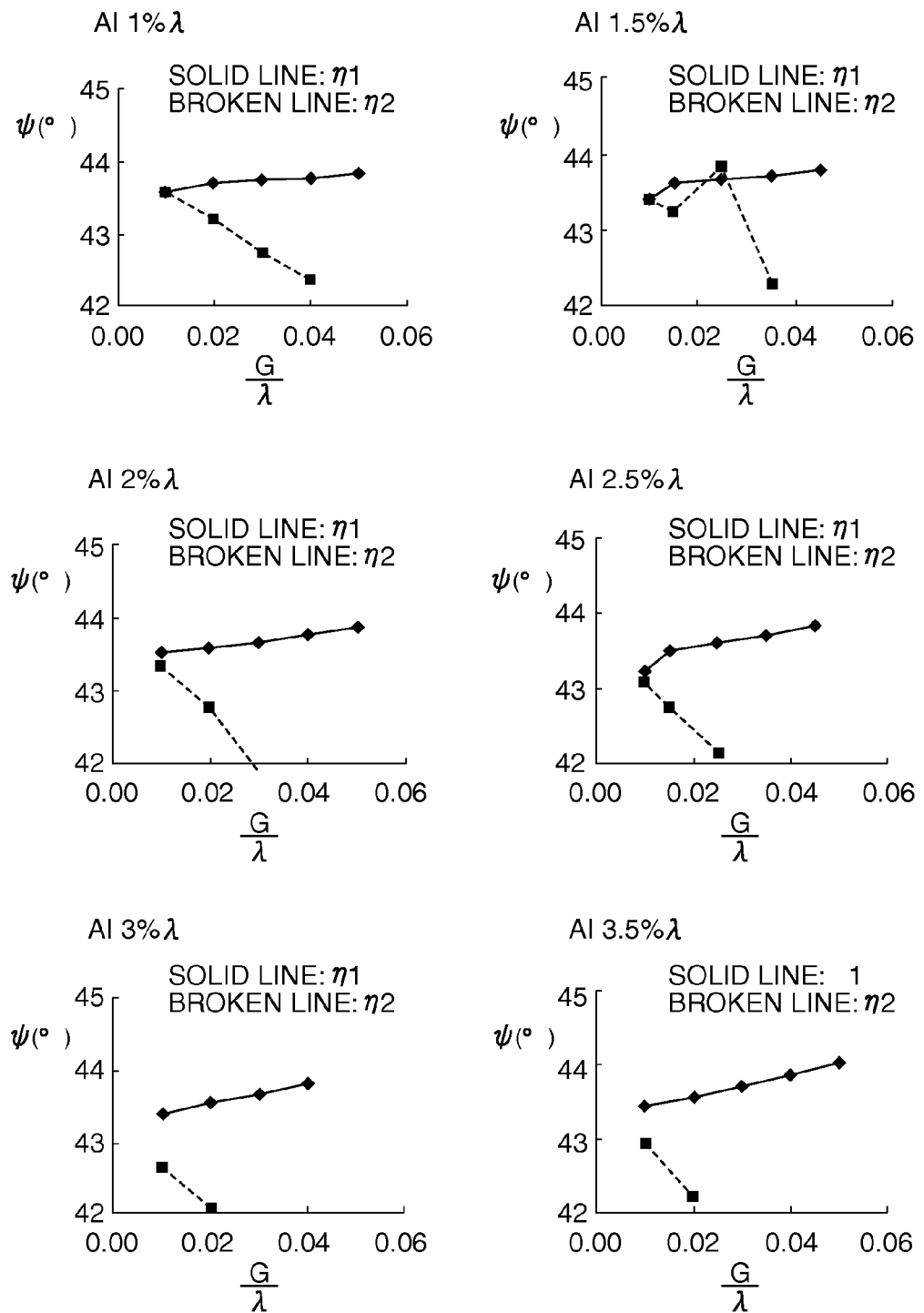
FIG. 28 shows graphs illustrating the relationships between the inter-electrode-finger groove and the Euler angle ψ when the electrode film thickness and the line occupancy η are determined.

Next, FIG. 13 shows graphs illustrating the relationship between η with the secondary temperature coefficient of β=0, that is, the line occupancy η representing a tertiary temperature characteristic, and the groove depth G. The quartz substrate 30 has the Euler angles of (0°, 123°, ψ). Here, an angle at which the frequency temperature characteristic shows the tendency of the cubic curve, that is, an angle at which the secondary temperature coefficient is β=0, is properly selected as ψ. The relationships between the Euler angle ψ at which η with β=0 is obtained and the groove depth G under the same condition as shown in FIG. 13 are shown in FIG. 28. In the graph with the electrode film thickness of H=0.02λ in FIG. 28, the plot of ψ<42° is not shown, but ψ=41.9° at G=0.03λ is shown in the plot of η2 of the graph. The plot of the relationship between the groove depth G at each electrode film thickness and the line occupancy η is obtained from FIGS. 16 to 21, the details of which are described later.

It can be seen from FIG. 13 that the variation of η1 due to the variation of the groove depth G is smaller than the variation of η2 with any thickness, as described above. Accordingly, η1 is extracted from the graph of thicknesses in FIG. 13 and is arranged in FIG. 14. It can be seen from FIG. 14 that η1 is concentrated in the line indicated by a broken line. Further, in FIG. 14, the plot indicating the upper limit of the line occupancy η represents the SAW device with the electrode film thickness of H=0.01λ and the plot indicating the lower limit of the line occupancy η represents the SAW device with the electrode film thickness of H=0.035λ. That is, as the electrode film thickness H increases, the line occupancy η in which the secondary temperature coefficient is β=0 decreases.

By calculating the approximate expression of the plot indicating the upper limit of the line occupancy η and the plot indicating the lower limit of the line occupancy η on the basis of the above description, the following expressions (12) and (13) can be derived.

$$\eta = -2.5 \times \frac{G}{\lambda} + 0.775 \tag{12}$$

$$\eta = -2.5 \times \frac{G}{\lambda} + 0.675 \tag{13}$$

Figure 14:
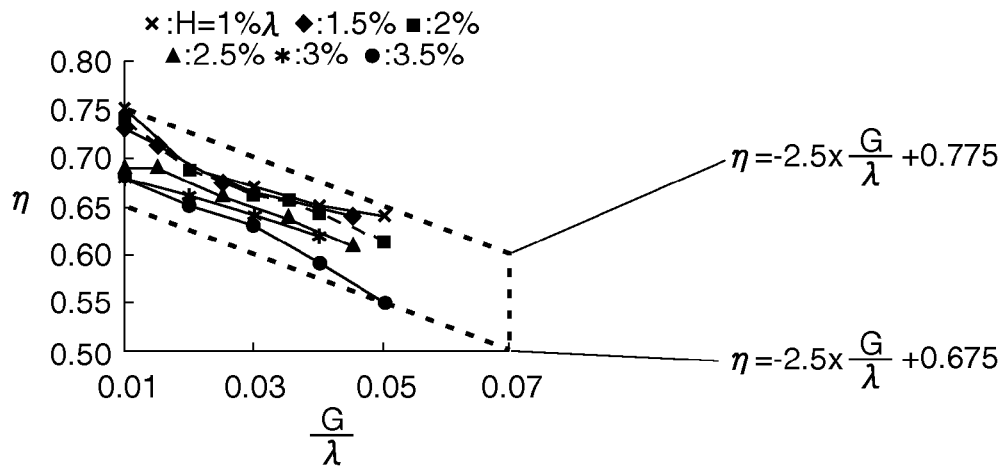
FIG. 14 is a diagram in which the relationships between η1 and the depth of the inter-electrode-finger groove in which the secondary temperature coefficient is 0 for each electrode film thickness are arranged in a graph.

It can be understood from the above expressions (12) and (13) that η in the range surrounded with the broken line in FIG. 14 can be determined in the range expressed by the following expression (14).

$$-2.5 \times \frac{G}{\lambda} + 0.675 \leq \eta \leq -2.5 \times \frac{G}{\lambda} + 0.775 \tag{14}$$

Here, when the secondary temperature coefficient β is permitted within ±0.01 ppm/° $C.^2$, it is confirmed that expressions (11) and (14) are both satisfied and thus the secondary temperature coefficient β is in the range of ±0.01 ppm/° $C.^2$.

Figure 15:
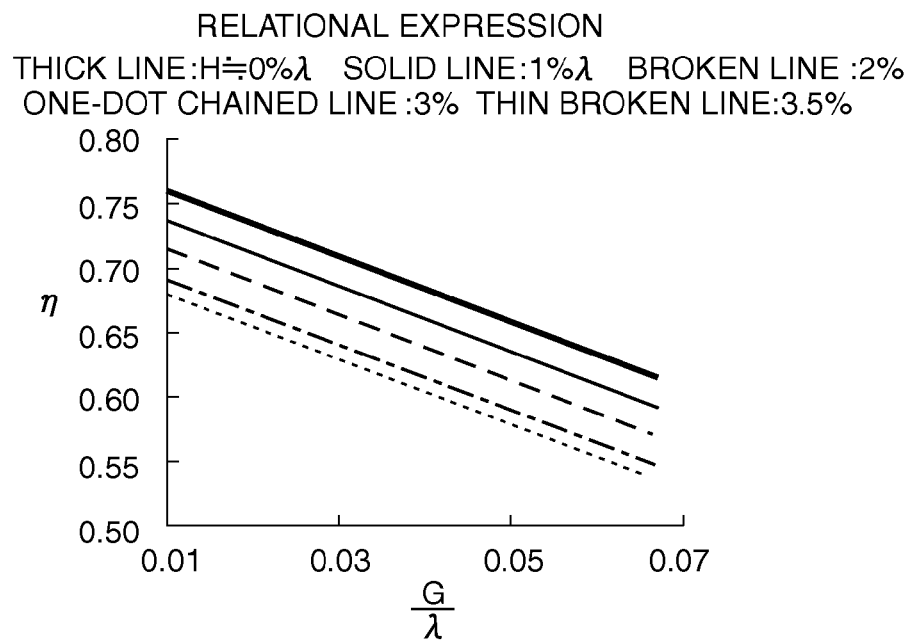
FIG. 15 is a diagram in which the relationships between the inter-electrode-finger groove and the line occupancy η are approximated to straight lines while changing the electrode film thickness from H≈0 to H=0.035λ.

Further, when the relationships between the groove depth G with β=0 and the line occupancy η in the SAW devices 10 with the electrode film thickness of H≈0, 0.01λ, 0.02λ, 0.03λ, and 0.035λ are expressed by approximate straight lines on the basis of the expressions (12) to (14), the straight lines shown in FIG. 15 are obtained. The relationships between the groove depth G and the line occupancy η in the quartz substrate 30 not having an electrode film formed thereon are as shown in FIG. 10.

The relational expression between the groove depth G and the line occupancy η in which the frequency temperature characteristic is excellent can be expressed by the following expression (15) on the basis of the approximate expressions indicating the approximate straight lines with the electrode thicknesses H.

$$\eta = -2.533 \times \frac{G}{\lambda} - 2.269 \times \frac{H}{\lambda} + 0.785 \tag{15}$$

As for the line occupancy η, the production tolerance of the electrical characteristic (particularly, the resonance frequency) increases as the electrode film thickness increases. Accordingly, there is a high possibility that a production tolerance of ±0.04 or less occurs when the electrode film thickness H is in the range expressed by expression (6) and a production tolerance greater than ±0.04 occurs when the electrode film thickness is in the range of H>0.035λ. However, when the electrode film thickness H is in the range expressed by the expression (6) and the tolerance of the line occupancy η is ±0.04 or less, it is possible to embody an SAW device with a small secondary temperature coefficient β. That is, when the secondary temperature coefficient β is set to ±0.01 ppm/° $C.^2$ or less in consideration of the production tolerance of the line occupancy, the line occupancy η can be extended to the range expressed by the following expression (16) which is obtained by adding the tolerance of ±0.04 to the expression (15).

$$\eta = -2.533 \times \frac{G}{\lambda} - 2.269 \times \frac{H}{\lambda} + 0.785 \pm 0.04 \tag{16}$$

FIGS. 16 to 21 show graphs illustrating the relationships between the line occupancy η and the secondary temperature coefficient β when the electrode film thickness is changed to 0.01λ (1% λ), 0.015λ (1.5% λ), 0.02λ (2% λ), 0.025λ (2.5% λ), 0.03λ (3% λ), and 0.035λ (3.5% λ) and the groove depth G is changed.

Further, FIGS. 22 to 27 show graphs illustrating the relationships between the line occupancy η and the frequency variation ΔF in the SAW devices 10 corresponding to FIGS.

16 to 21. All the quartz substrates have the Euler angles of (0°, 123°, ψ) and an angle at which ΔF is the minimum is properly selected for ψ.

Figure 16:
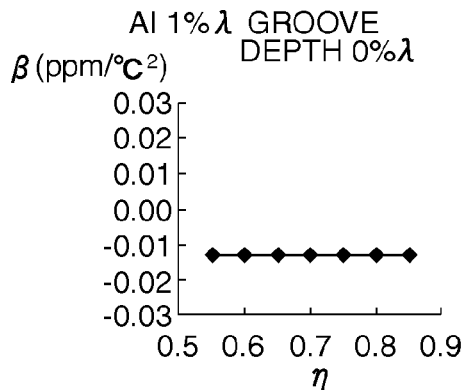
FIG. 16 shows graphs illustrating the relationships between the line occupancy η and the secondary temperature coefficient β when the depth of the inter-electrode-finger groove is changed with the electrode film thickness of 0.01λ.
Figure 16:
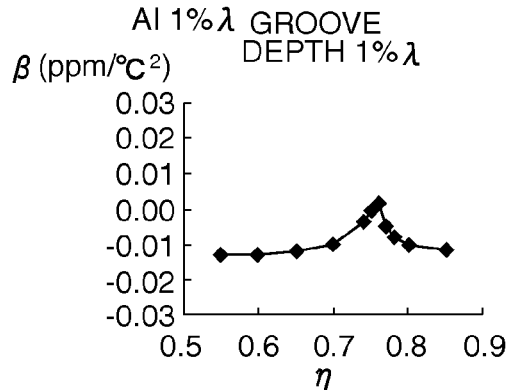
Figure 16:
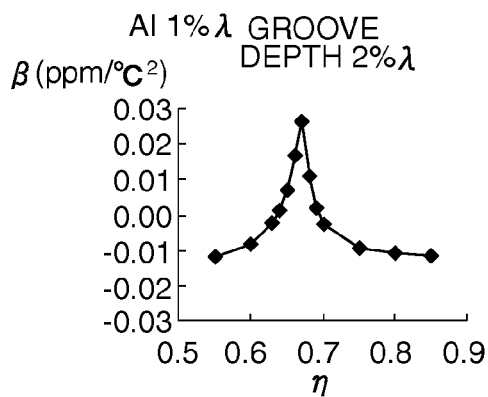
Figure 16:
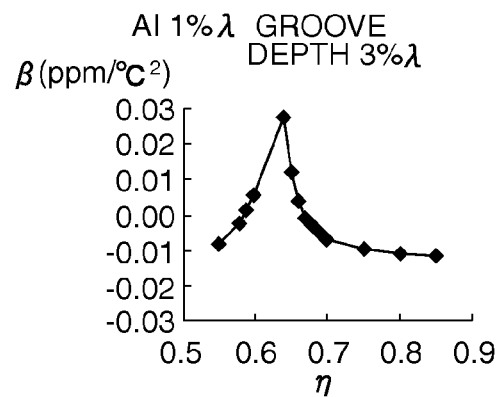
Figure 16:
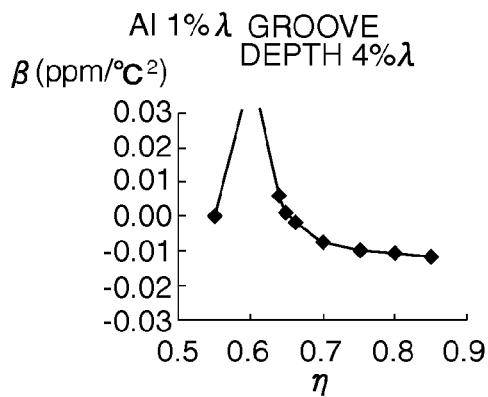
Figure 16:
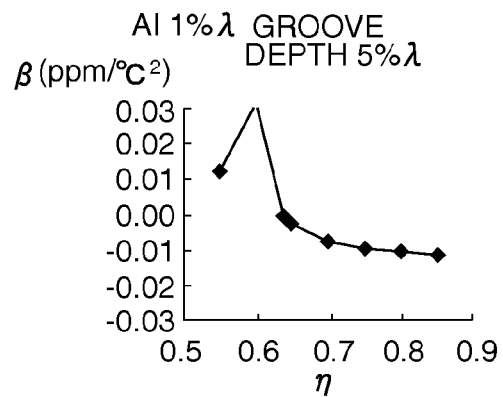
Figure 22:
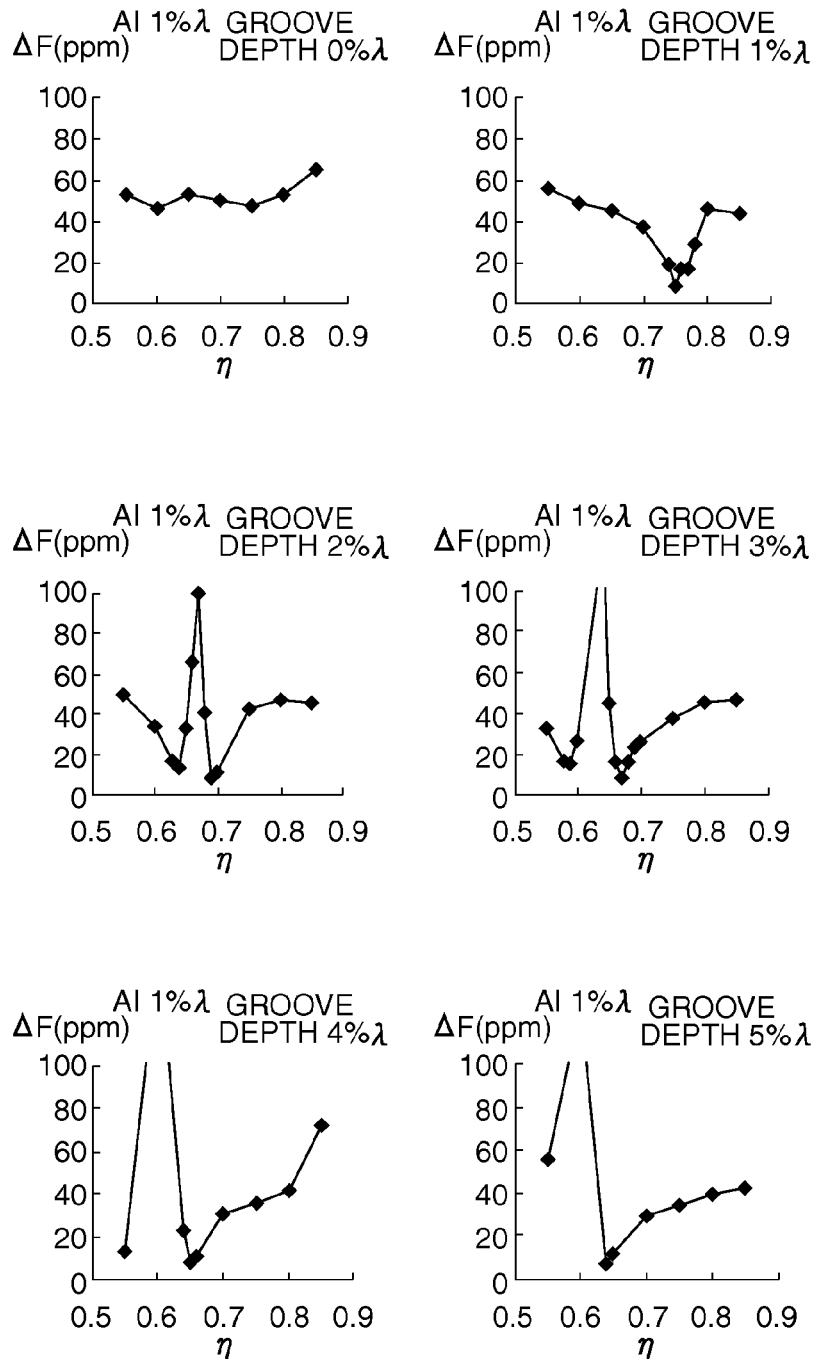
FIG. 22 shows graphs illustrating the relationships between the line occupancy η and the frequency variation ΔF when the depth of the inter-electrode-finger groove is changed with the electrode film thickness of 0.01λ.

Here, FIG. 16 is a diagram illustrating the relationship between the line occupancy η and the secondary temperature coefficient β when the electrode film thickness H is 0.01λ and FIG. 22 is a diagram illustrating the relationship between the line occupancy η and the frequency variation ΔF when the electrode film thickness H is 0.01λ.

Figure 17:
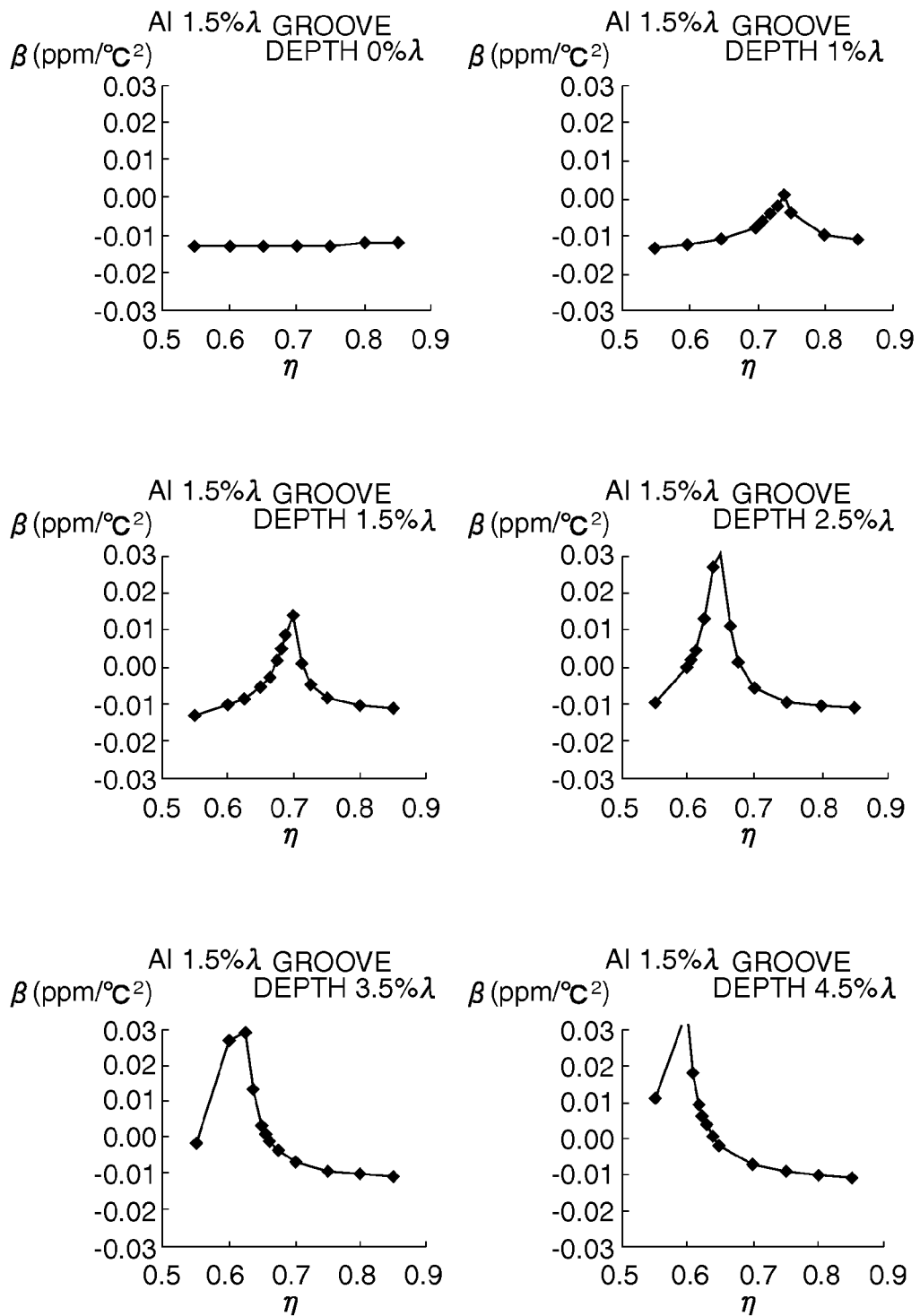
FIG. 17 shows graphs illustrating the relationships between the line occupancy η and the secondary temperature coefficient β when the depth of the inter-electrode-finger groove is changed with the electrode film thickness of 0.015λ.
Figure 23:
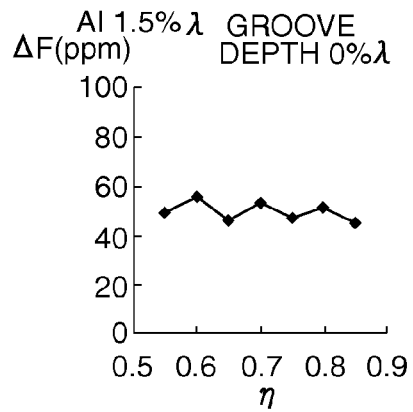
FIG. 23 shows graphs illustrating the relationships between the line occupancy η and the frequency variation ΔF when the depth of the inter-electrode-finger groove is changed with the electrode film thickness of 0.015λ.
Figure 23:
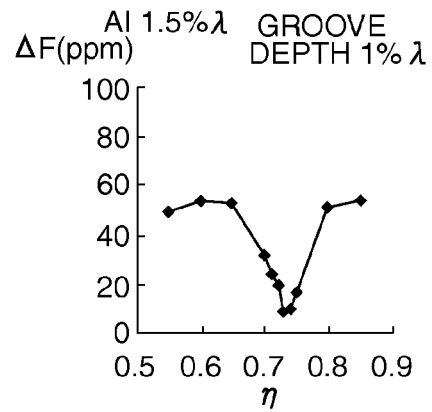
Figure 23:
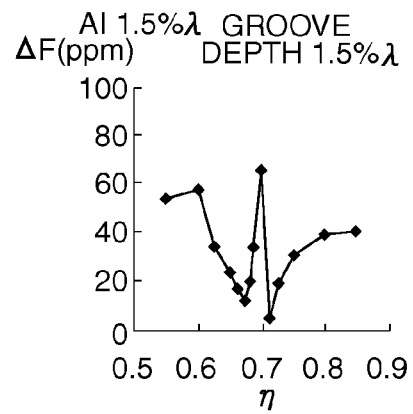
Figure 23:
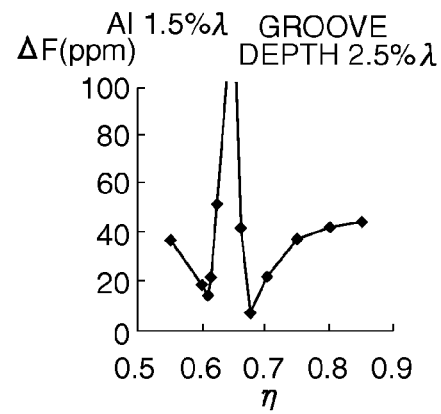
Figure 23:
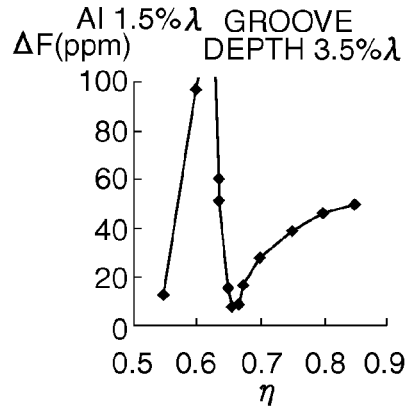
Figure 23:
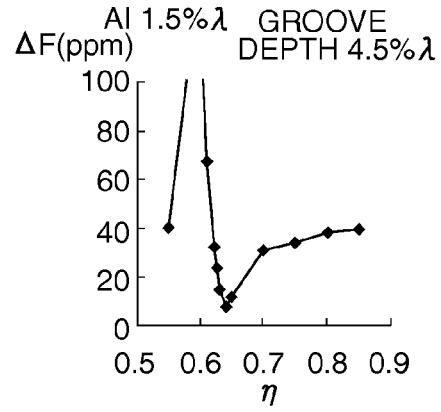

Further, FIG. 17 is a diagram illustrating the relationship between the line occupancy η and the secondary temperature coefficient β when the electrode film thickness H is 0.015λ and FIG. 23 is a diagram illustrating the relationship between the line occupancy η and the frequency variation ΔF when the electrode film thickness H is 0.015λ.

Figure 18:
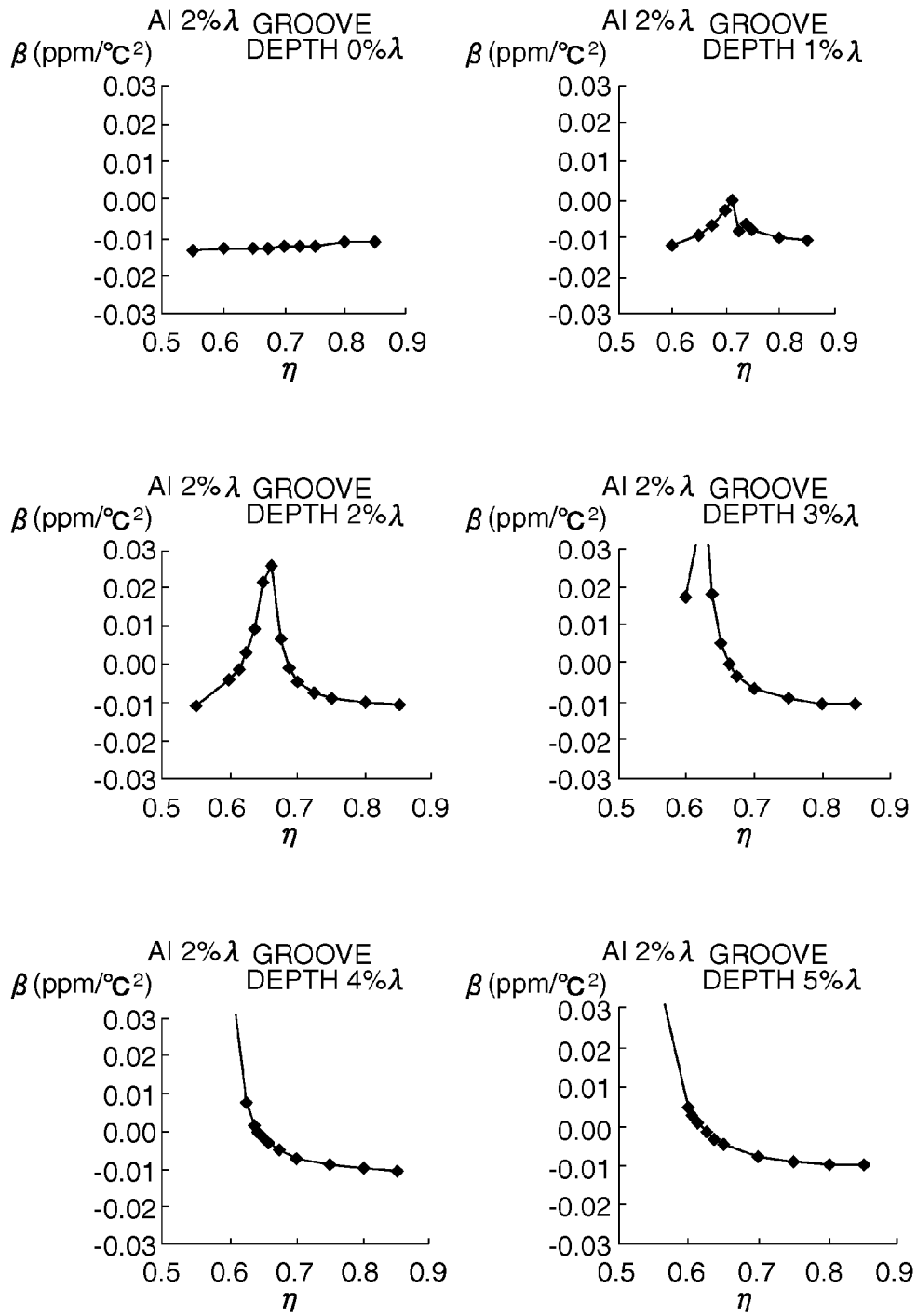
FIG. 18 shows graphs illustrating the relationships between the line occupancy η and the secondary temperature coefficient β when the depth of the inter-electrode-finger groove is changed with the electrode film thickness of 0.02λ.
Figure 24:
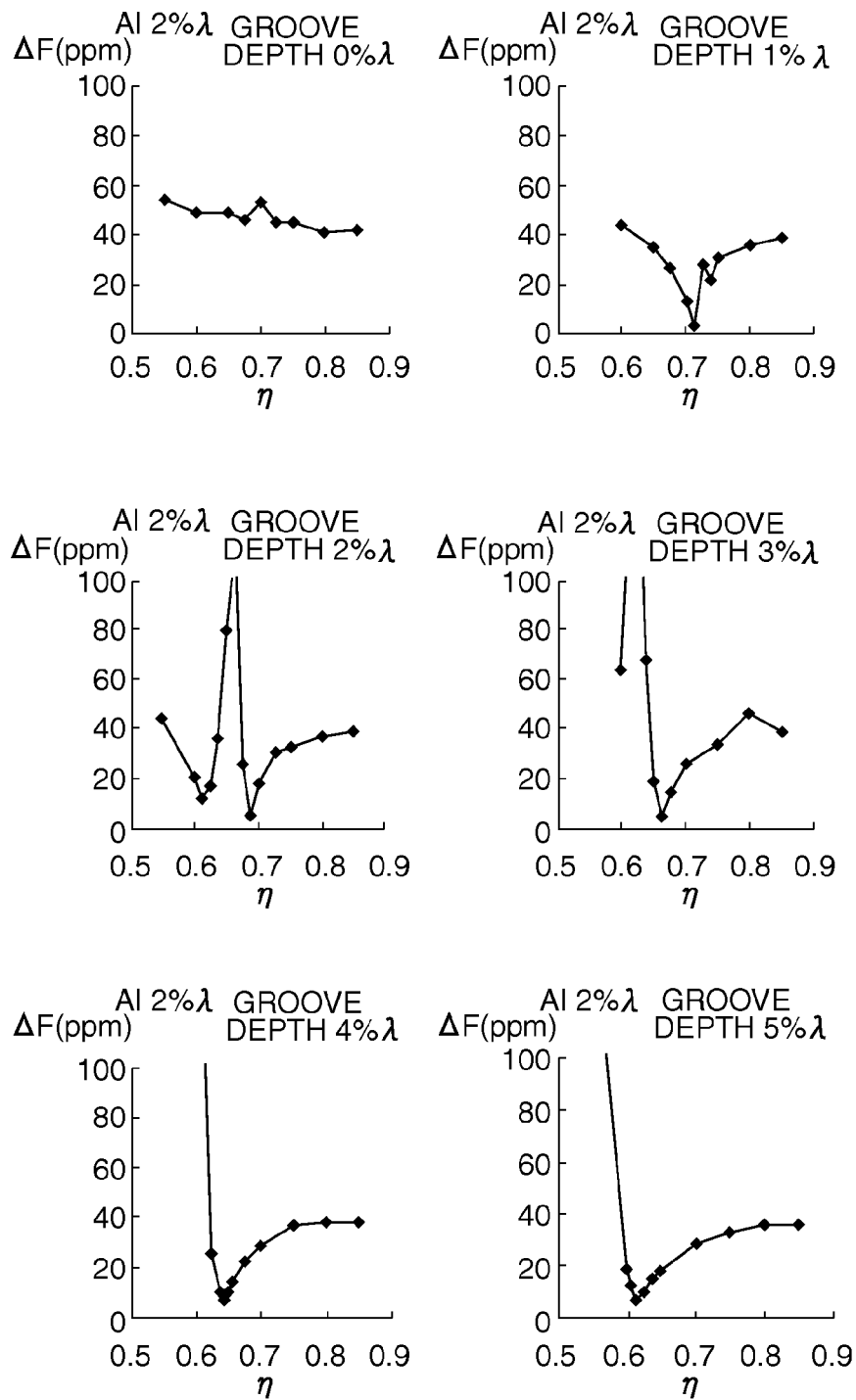
FIG. 24 shows graphs illustrating the relationships between the line occupancy η and the frequency variation ΔF when the depth of the inter-electrode-finger groove is changed with the electrode film thickness of 0.02λ.

Further, FIG. 18 is a diagram illustrating the relationship between the line occupancy η and the secondary temperature coefficient β when the electrode film thickness H is 0.02λ and FIG. 24 is a diagram illustrating the relationship between the line occupancy η and the frequency variation ΔF when the electrode film thickness H is 0.02λ.

Figure 19:
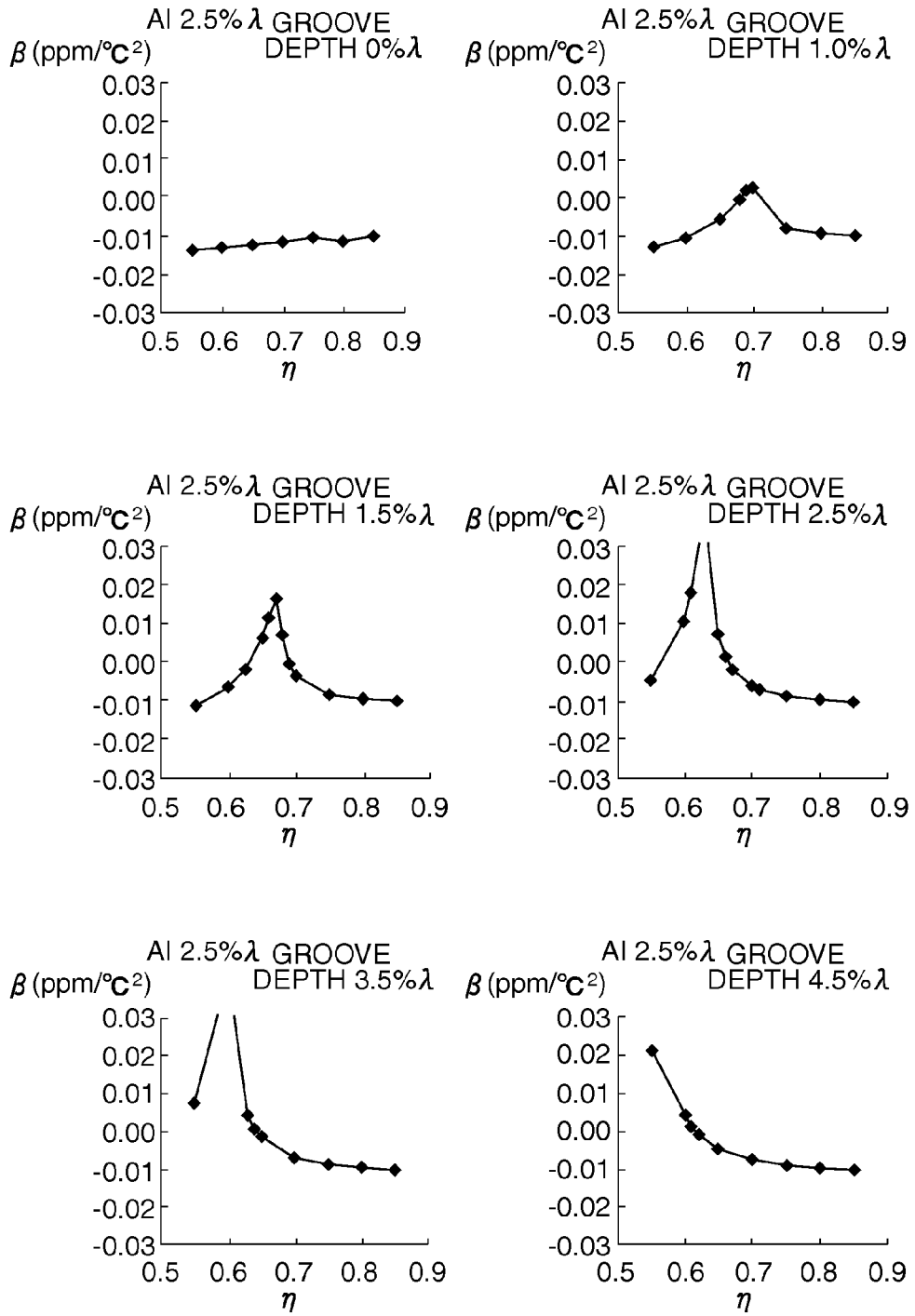
FIG. 19 shows graphs illustrating the relationships between the line occupancy η and the secondary temperature coefficient β when the depth of the inter-electrode-finger groove is changed with the electrode film thickness of 0.025λ.
Figure 25:
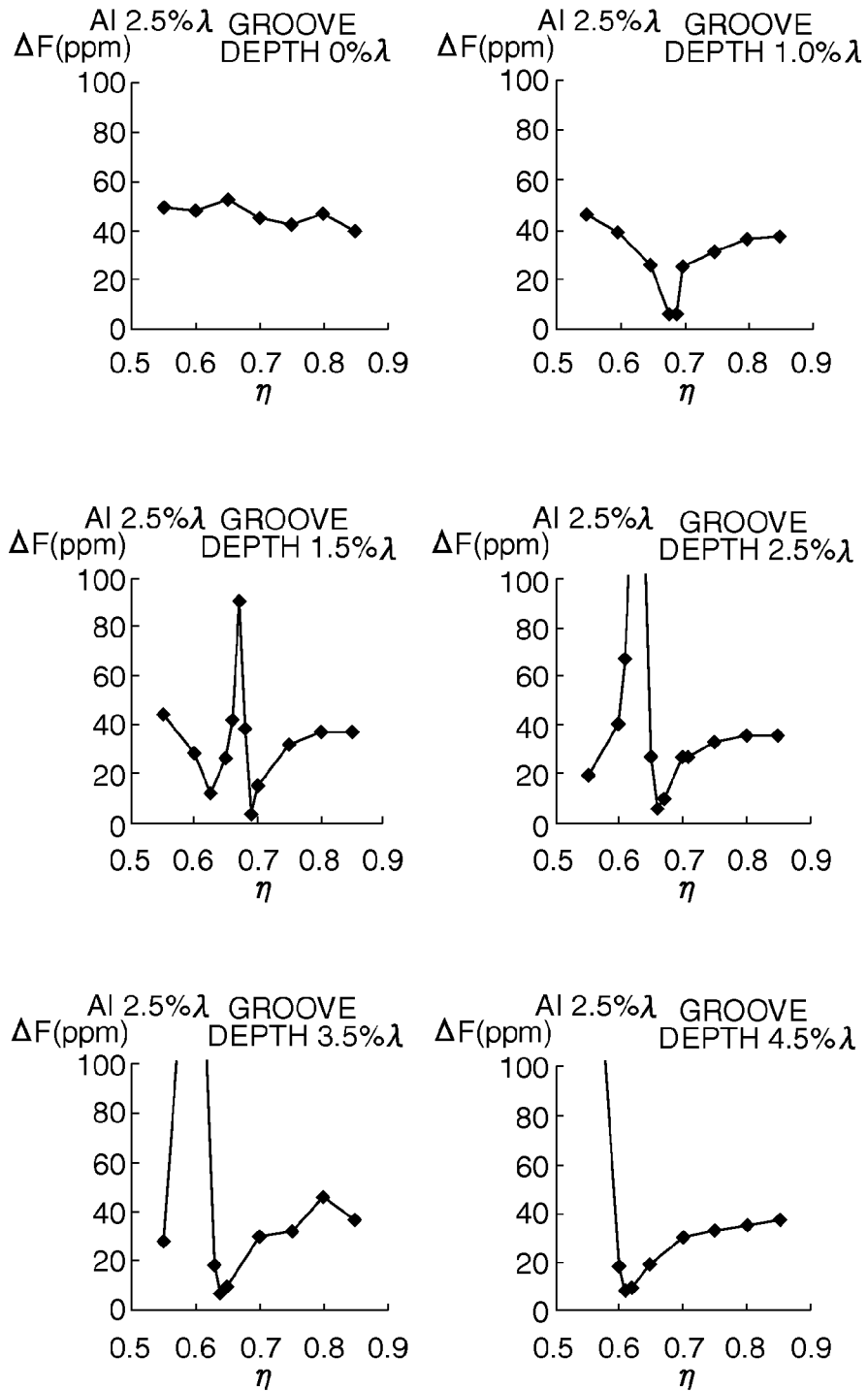
FIG. 25 shows graphs illustrating the relationships between the line occupancy η and the frequency variation ΔF when the depth of the inter-electrode-finger groove is changed with the electrode film thickness of 0.025λ.

Further, FIG. 19 is a diagram illustrating the relationship between the line occupancy η and the secondary temperature coefficient β when the electrode film thickness H is 0.025λ and FIG. 25 is a diagram illustrating the relationship between the line occupancy η and the frequency variation ΔF when the electrode film thickness H is 0.025λ.

Figure 20:
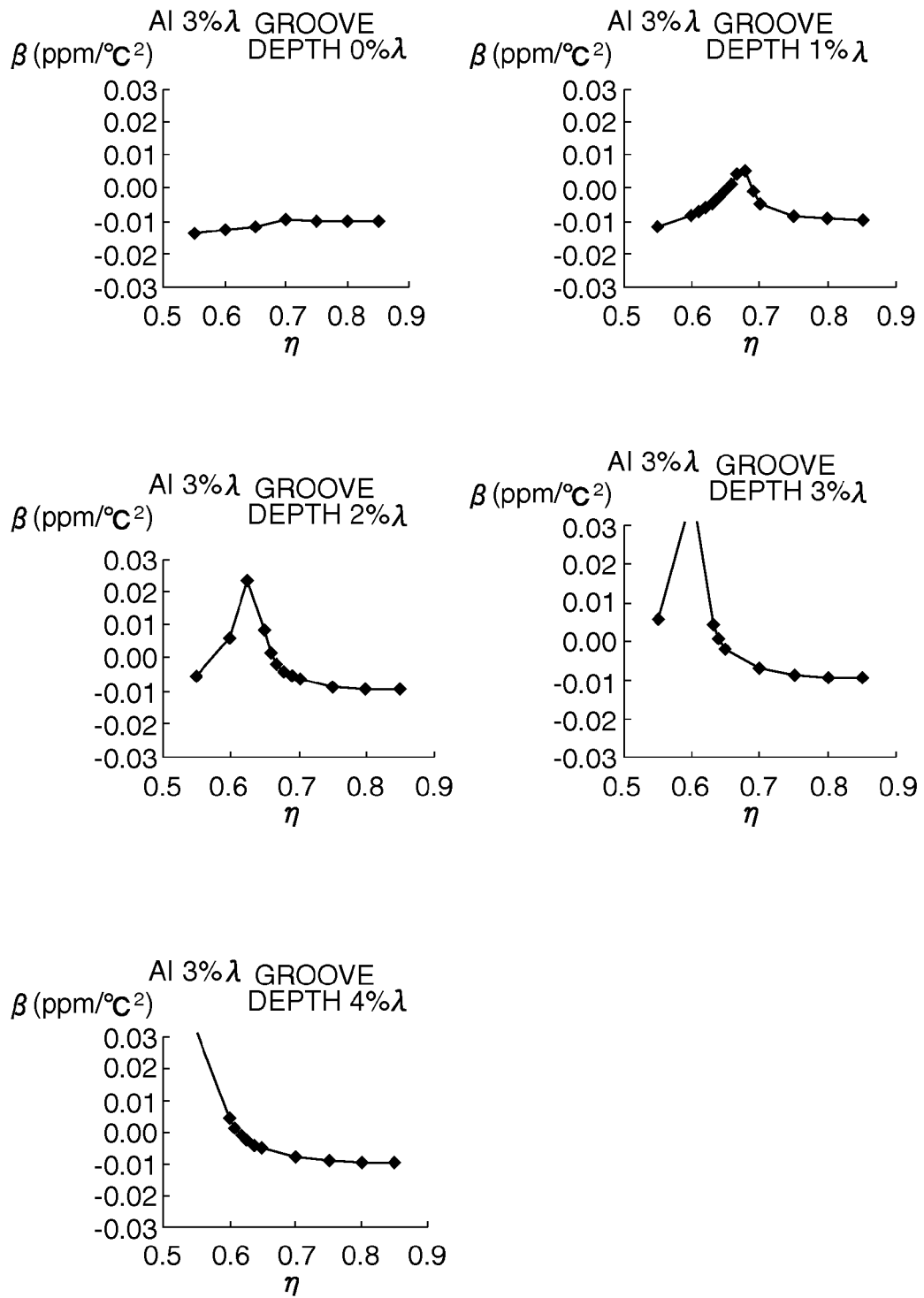
FIG. 20 shows graphs illustrating the relationships between the line occupancy η and the secondary temperature coefficient β when the depth of the inter-electrode-finger groove is changed with the electrode film thickness of 0.03λ.
Figure 26:
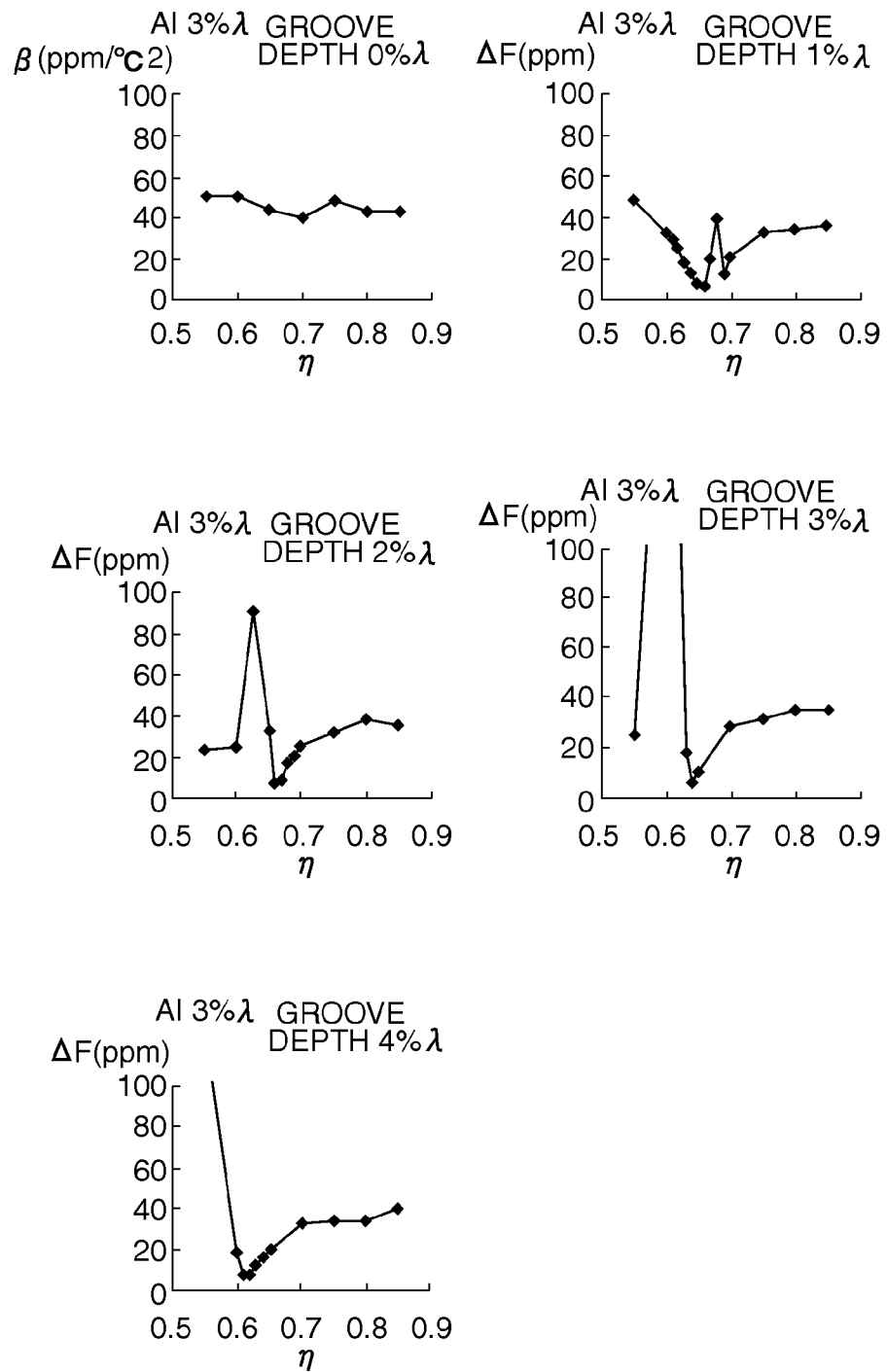
FIG. 26 shows graphs illustrating the relationships between the line occupancy η and the frequency variation ΔF when the depth of the inter-electrode-finger groove is changed with the electrode film thickness of 0.03λ.

Further, FIG. 20 is a diagram illustrating the relationship between the line occupancy η and the secondary temperature coefficient β when the electrode film thickness H is 0.03λ and FIG. 26 is a diagram illustrating the relationship between the line occupancy η and the frequency variation ΔF when the electrode film thickness H is 0.03λ.

Figure 21:
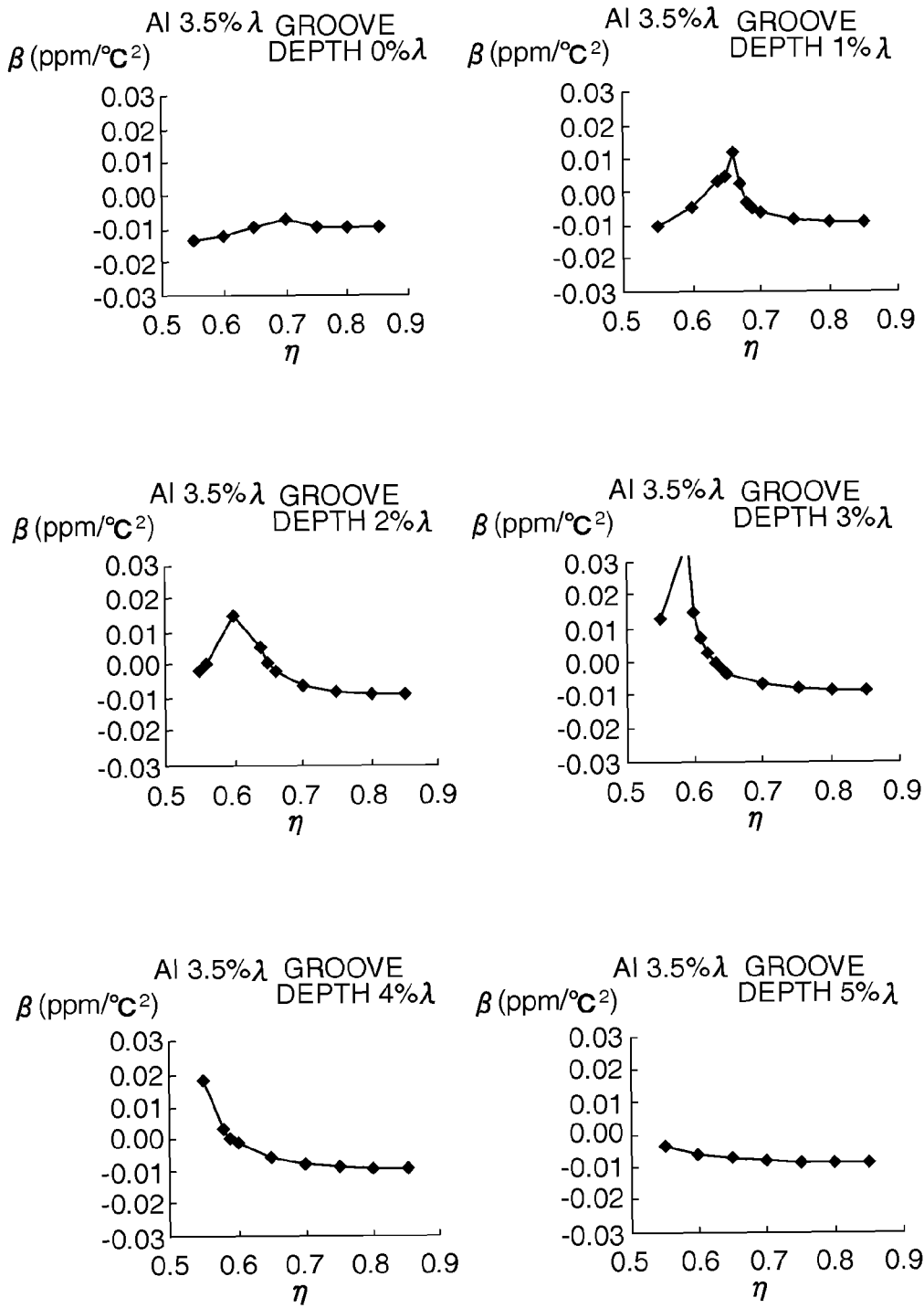
FIG. 21 shows graphs illustrating the relationships between the line occupancy η and the secondary temperature coefficient β when the depth of the inter-electrode-finger groove is changed with the electrode film thickness of 0.035λ.
Figure 27:
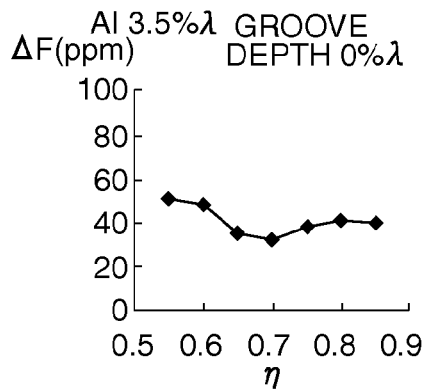
FIG. 27 shows graphs illustrating the relationships between the line occupancy η and the frequency variation ΔF when the depth of the inter-electrode-finger groove is changed with the electrode film thickness of 0.035λ.
Figure 27:
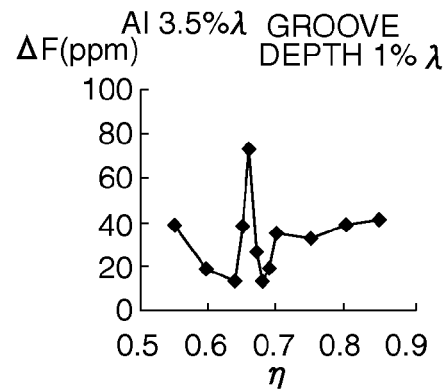
Figure 27:
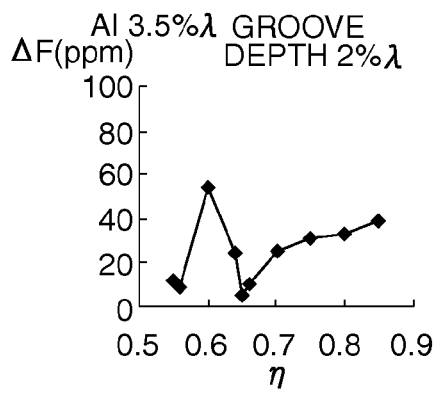
Figure 27:
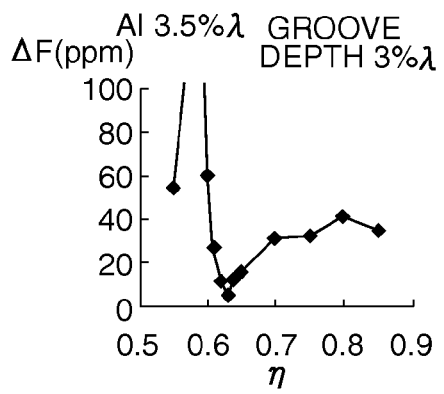
Figure 27:
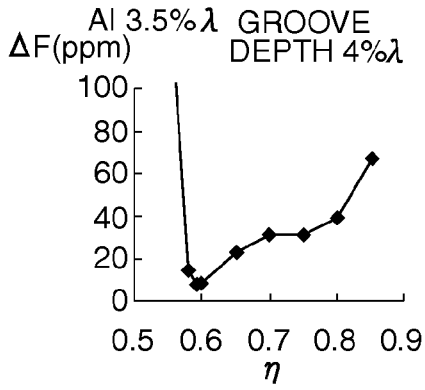
Figure 27:
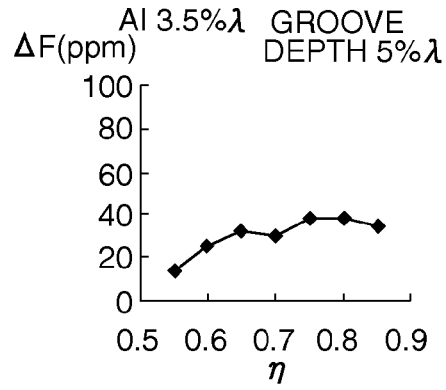

Further, FIG. 21 is a diagram illustrating the relationship between the line occupancy η and the secondary temperature coefficient β when the electrode film thickness H is 0.035λ and FIG. 27 is a diagram illustrating the relationship between the line occupancy η and the frequency variation ΔF when the electrode film thickness H is 0.035λ.

In the drawings (FIGS. 16 to 27), a minute difference exists in the graphs, but it can be seen that the variation tendency is similar to FIGS. 9 and 11 which are the graphs illustrating the relationships between the line occupancy η and the secondary temperature coefficient β and between the line occupancy η and the frequency variation ΔF only in the quartz substrate 30.

That is, it can be said that the advantage of this embodiment can be obtained in the propagation of the surface acoustic wave only in the quartz substrate 30 excluding the electrode films.

Figure 29:
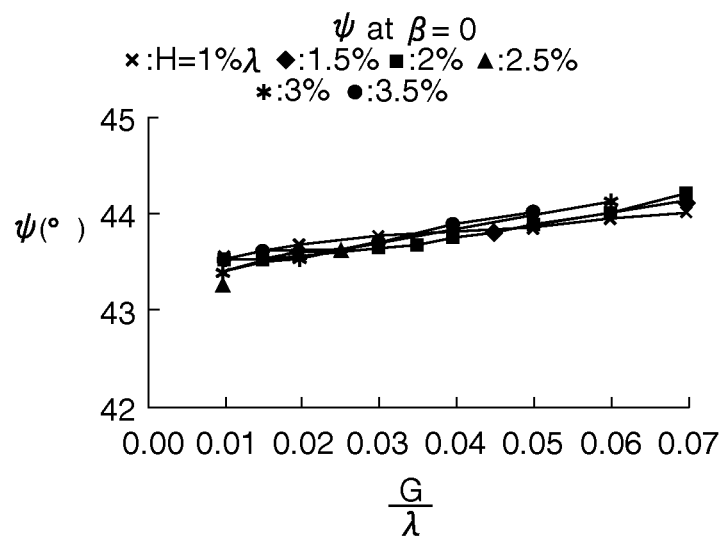
FIG. 29 is a diagram in which the relationships between the inter-electrode-finger groove and the Euler angle ψ when the electrode film thickness is changed are arranged in a graph.

The relationships between ψ acquired from η1 in the graphs shown in FIG. 28 and the groove depth G are arranged in FIG. 29. The reason for selecting η1 is as described above. As shown in FIG. 29, even when the electrode film thickness is changed, it can be seen that the angle of ψ is hardly changed and the optimal angle of ψ varies with the variation of the groove depth G. This proves that the variation of the secondary temperature coefficient β is greatly affected by the shape of the quartz substrate 30.

Figure 30:
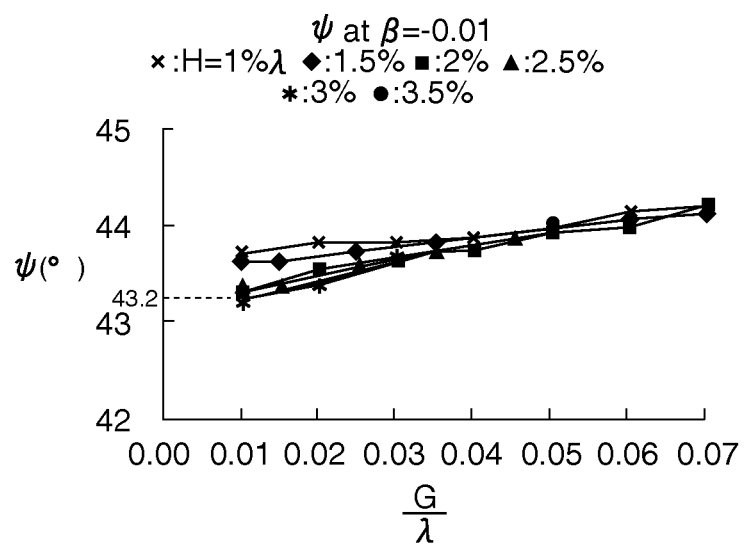
FIG. 30 is a graph illustrating the relationship between the inter-electrode-finger groove and the Euler angle ψ when the secondary temperature coefficient β is −0.01 ppm/°$C^2$.
Figure 31:
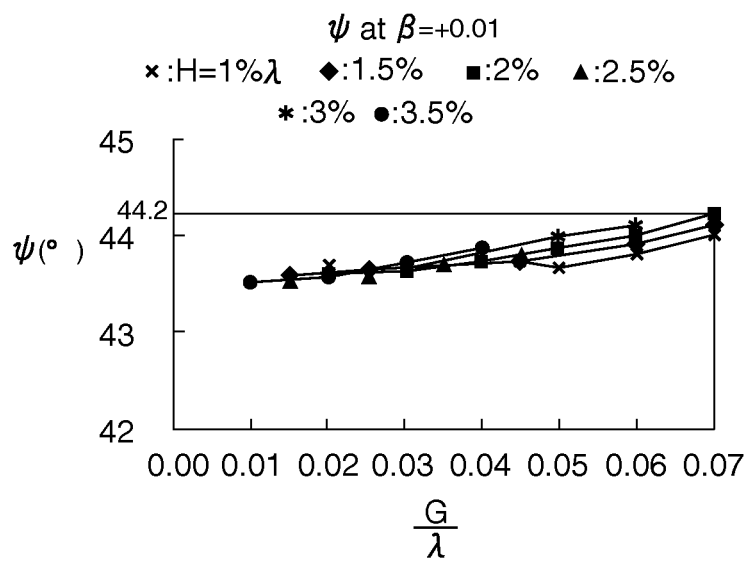
FIG. 31 is a graph illustrating the relationship between the inter-electrode-finger groove and the Euler angle ψ when the secondary temperature coefficient β is +0.01 ppm/°$C^2$.

In the same way as described above, the relationships of the groove depth G to ψ at which the secondary temperature coefficient is β=−0.01 ppm/° C.² and ψ at which the secondary temperature coefficient is β=+0.01 ppm/° C.² are acquired and arranged in FIGS. 30 and 31. When the angle of ψ satisfying −0.01≦β≦+0.01 is calculated from the graphs (FIGS. 29 to 31), the angle range of ψ under the above-mentioned condition can be determined preferably as 43°<ψ<45° and more preferably as 43.2°≦ψ≦44.2°.

Figure 32:
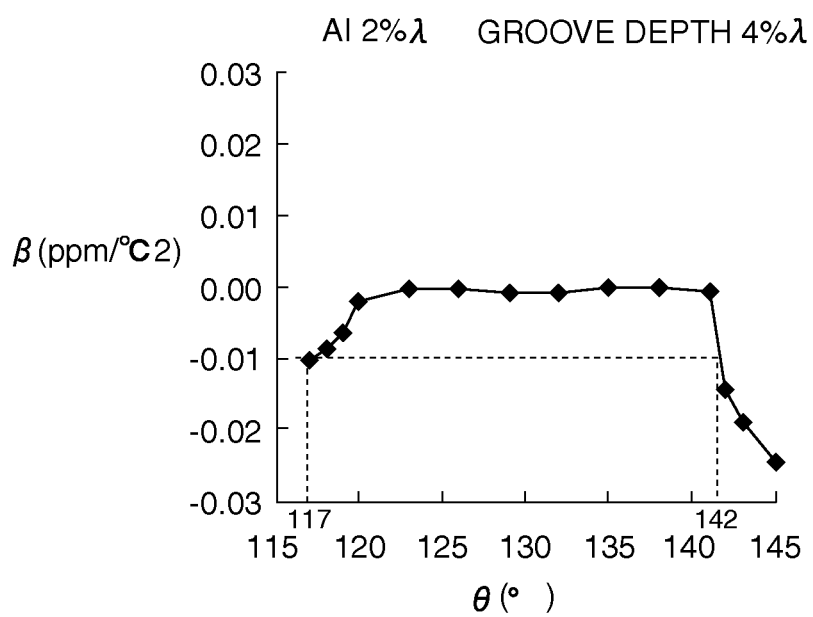
FIG. 32 is a graph illustrating the relationship between the Euler angle θ and the secondary temperature coefficient β when the electrode film thickness is 0.02λ and the depth of the inter-electrode-finger groove is 0.04λ.

The variation of the secondary temperature coefficient β when the angle of θ is given, that is, the relationship between θ and the secondary temperature coefficient β is shown in FIG. 32. Here, the SAW device used in the simulation includes a quartz substrate in which the cut angle and the SAW propagation direction are expressed by the Euler angles (0, θ, ψ) and the groove depth G is 0.04λ, where the electrode film thickness H is 0.02λ. As for ψ, a value at which the absolute value of the secondary temperature coefficient β is the minimum is selected in the above-mentioned angle range on the basis of the set angle of θ. Further, η is set to 0.6383 on the basis of the expression (15).

Under this condition, it can be seen from FIG. 32 illustrating the relationship between θ and the secondary temperature coefficient β that when θ is in the range of 117° to 142°, the absolute value of the secondary temperature coefficient β is in the range of 0.01 ppm/° C.². Accordingly, by determining θ in the range of 117°≦θ≦142° with the above-mentioned set value, it can be said that it is possible to configure the SAW device 10 having an excellent frequency temperature characteristic.

Figure 33:
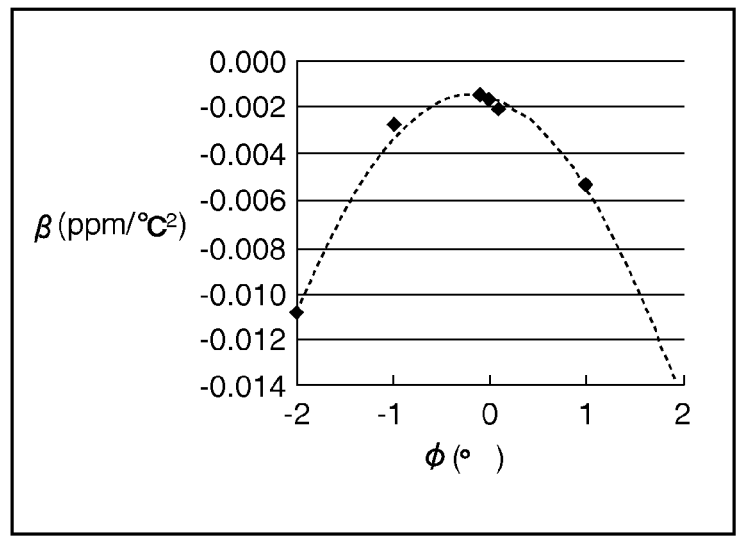
FIG. 33 is a graph illustrating the relationship between the Euler angle φ and the secondary temperature coefficient β.

FIG. 33 is a graph illustrating the relationship between the angle of φ and the secondary temperature coefficient β when the groove depth G is 0.04λ, the electrode film thickness H is 0.02λ, and the line occupancy η is 0.65 in the quartz substrate 30 with the Euler angles of (φ, 123°, 43.77°).

It can be seen from FIG. 33 that the secondary temperature coefficient β is lower than −0.01 when φ is −2° and +2°, but the absolute value of the secondary temperature coefficient β is in the range of 0.01 when φ is in the range of −1.5° to +1.5°. Accordingly, by determining φ in the range of −1.5°≦φ≦+1.5° and preferably −1°≦θ≦+1° with the above-mentioned set value, it is possible to configure the SAW device 10 with an excellent frequency temperature characteristic.

Figure 34:
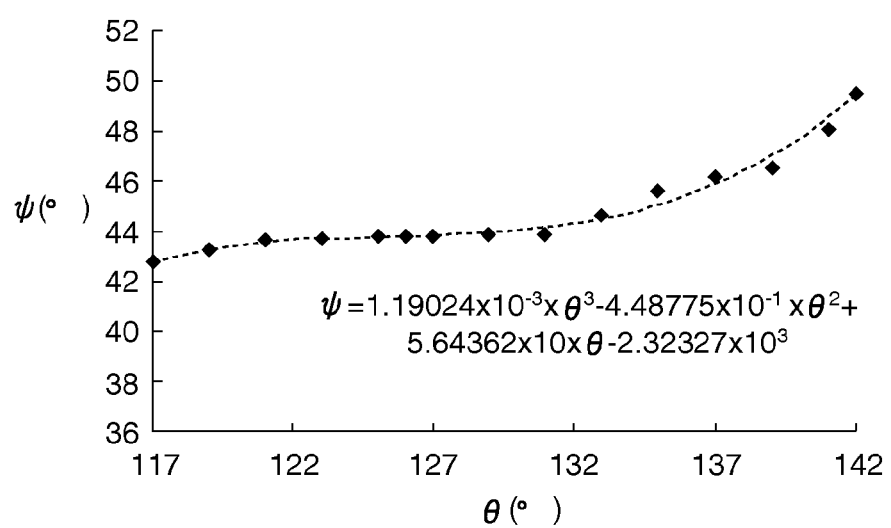
FIG. 34 is a graph illustrating the relationship between the Euler angle θ and the Euler angle ψ in which the frequency temperature characteristic is excellent.

In the above description, the ranges of the optimal values of φ, θ and ψ are derived from the relationship to the groove depth G under a predetermined condition. On the other hand, FIG. 34 shows the very desirable relationship between θ and ψ in which the frequency variation is the minimum in the range of −40° C. to +85° C. and the approximate expression thereof is calculated. As shown in FIG. 34, the angle of ψ varies with the increase of the angle of θ and increases to draw a cubic curve. In the example shown in FIG. 34, ψ is 42.79° at θ=117° and ψ is 49.57° at θ=142°. The approximate curve of these plots is a curve indicated by a broken line in FIG. 34 and can be expressed by the following expression (17) as an approximate expression.

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad (17)$$

From this expression, ψ can be determined by determining θ and the range of ψ when the range of θ is set to the range of 117°≦θ≦142° can be set to 42.79°≦ψ≦49.57°. The groove depth G and the electrode film thickness H in the simulation are set to G=0.04λ and H=0.02λ, respectively.

For the above-mentioned reason, in this embodiment, by configuring the SAW device 10 under various predetermined conditions, it is possible to obtain an SAW device with an excellent frequency temperature characteristic satisfying a target value.

Figure 41:
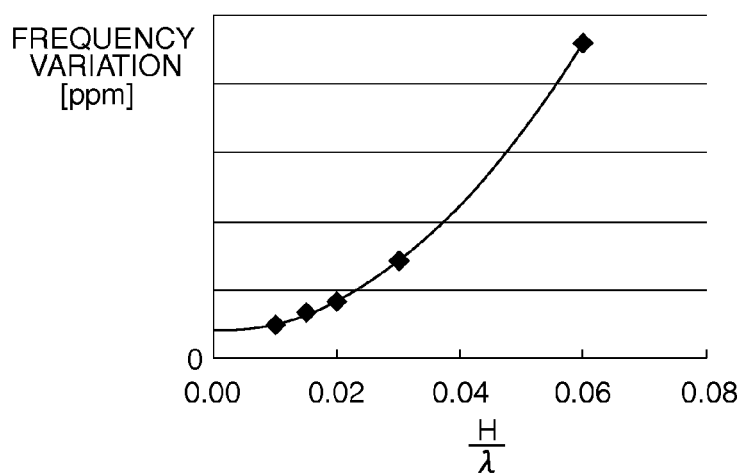
FIG. 41 is a graph illustrating the relationship between the electrode film thickness and the frequency variation in a heat cycle test.

Further, in the SAW device 10 according to this embodiment, as shown in the expression (6) and FIGS. 16 to 27, it is possible to improve the frequency temperature characteristic after the electrode film thickness H is set to the range of 0<H≦0.035λ. Unlike the improvement of the frequency temperature characteristic by greatly increasing the thickness H in the related art, it is possible to improve the frequency temperature characteristic while maintaining the environment resistance characteristic. FIG. 41 shows the relationship between the electrode thickness (Al electrode thickness) and the frequency variation in a heat cycle test. The result of the heat cycle test shown in FIG. 41 is obtained after the cycle in which the SAW device is exposed to an atmosphere of −55° C. for 30 minutes and is then exposed to an atmosphere of +125° C. for 30 minutes is repeated eight times. It can be seen from FIG. 41 that the frequency variation (F variation) in the range of the electrode thickness H of the SAW device 10 according to this embodiment is equal to or less than ⅓ of that in the case where the electrode thickness H is 0.06λ and the inter-electrode-finger groove is not disposed. In any plot of FIG. 41, H+G=0.06λ is set.

A high-temperature shelf test of leaving a sample in an atmosphere of 125° C. for 1000 hours was performed on the SAW device produced under the same condition as shown in FIG. 41. It was confirmed that the frequency variation before and after the test of the SAW device (under four conditions of H=0.03λ and G=0.03λ, H=0.02λ and G=0.04λ, H=0.015λ and G=0.045λ, and H=0.01λ and G=0.05λ) was equal to or less than ⅓ of that of the related art SAW device (under the condition of H=0.06λ and G=0).

In the SAW device 10 produced under the same conditions as described above and under the conditions that H+G=0.067λ (with an aluminum thickness of 2000 angstroms and a groove depth of 4700 angstroms), the line occupancy of the IDT is ηi=0.6, the line occupancy of the reflector is ηr=0.8, the Euler angles are (0°, 123°, 43.5°), the number of IDT pairs is 120, the intersection width is 40λ (λ=10 μm), the number of reflectors (one side) is 72 (36 pairs), and the tilt angle of the electrode fingers is zero (the arrangement direction of the electrode fingers is equal to the phase speed direction of the SAW), the frequency temperature characteristic shown in FIG. 35 is obtained.

FIG. 35 is a graph in which the frequency temperature characteristics of four test samples (n=4) are plotted. It can be seen from FIG. 35 that the frequency variation ΔF in the operating temperature range of the test samples is suppressed to be equal to or less than about 20 ppm.

In this embodiment, the influence on the frequency temperature characteristic depending on the groove depth G and the electrode thickness H has been described. However, the depth (height difference) which is the sum of the groove depth G and the electrode thickness H affects a static characteristic such as an equivalent circuit constant or CI value or a Q value. For example, FIG. 36 shows a graph illustrating the relationship between the height difference and the CI value when the height difference is changed in the range of 0.062λ to 0.071λ. It can be seen from FIG. 36 that the CI value converges at the height difference of 0.067λ and is not changed (not lowered) even at a greater height difference.

The frequency, the equivalent circuit constant, and the static characteristics in the SAW device 10 having the frequency temperature characteristic shown in FIG. 35 are arranged in FIG. 37. Here, F represents the frequency, Q represents the Q value, γ represents a capacity ratio, CI represents the CI (Crystal Impedance) value, and M represents a performance index (figure of merit), respectively.

Figure 39:
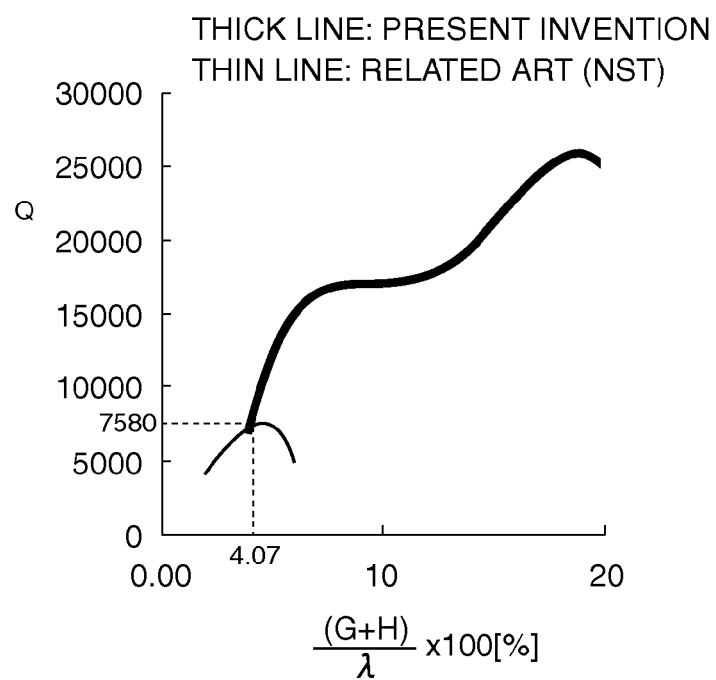
FIG. 39 is a graph illustrating the comparison of the relationship between the height difference and the Q value in the SAW device according to the embodiment of the invention with the relationship between the height difference and the Q value in a related art SAW device.

Further, FIG. 39 shows a graph illustrating the comparison of the relationship of the height difference and the Q value in the SAW device 10 where the grooves 32 are not formed in the quartz substrate 30 and in the SAW device 10 where the grooves 32 are formed therein. In FIG. 39, the graph indicated by a thick line represents a characteristic of the SAW device 10 where the grooves 32 are formed, and the graph indicated by a thin line represents a characteristic of the SAW device 10 where the grooves 32 are not formed therein. As can be clearly seen from FIG. 39, when the grooves are disposed between the electrode fingers and the resonance in the upper mode of the stop band is used, the Q value in the region where the height difference (G+H) is equal to or greater than 0.0407λ (4.07% λ) is higher than that in the case where the grooves are not disposed between the electrode fingers and the resonance in the lower mode of the stop band is used.

The basic data of the SAW device in the simulation is as follows. The basic data of the SAW device 10 where the grooves are formed includes H: 0.02λ, G: variable, IDT line occupancy ηi: 0.6, reflector line occupancy ηr: 0.8, Euler angles: (0°, 123°, 43.5°), number of pairs: 120, intersection width W: 40λ (λ=10 μm), number of reflectors (one side): 60, and no tilt angle of electrode finger. The basic data of the SAW device 10 where the grooves are not formed includes H: variable, G: zero, IDT line occupancy ηi: 0.4, reflector line occupancy ηr: 0.3, Euler angles: (0°, 123°, 43.5°), number of pairs: 120, intersection width W: 40λ (λ=10 μm), number of reflectors (one side): 60, and no tilt angle of electrode finger.

By referring to FIG. 37 or 39 for the purpose of comparison of the characteristics of the SAW devices, it can be understood how the SAW device 10 according to this embodiment increases in the Q value. It is thought that the increase in the Q value is due to the improvement of the energy trapping effect and the reason is as follows.

Figure 40:
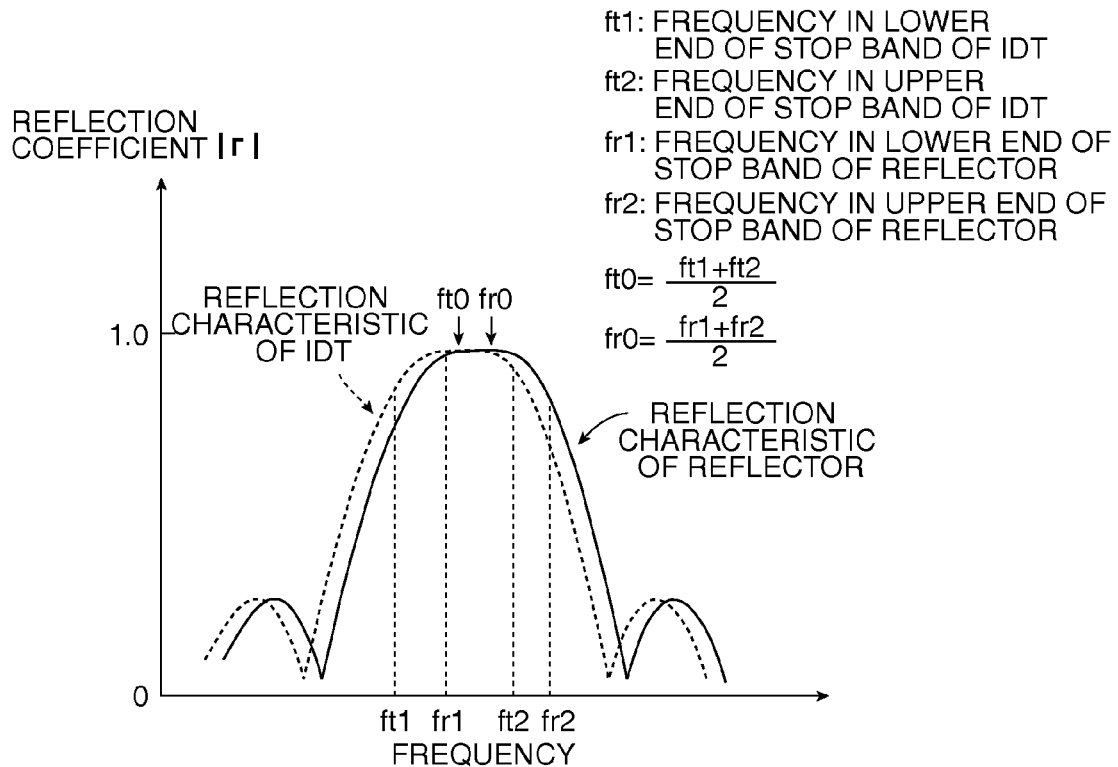
FIG. 40 is a diagram illustrating the SAW reflection characteristic of the IDT and the reflector.

In order to efficiently trap the energy of the surface acoustic wave excited in the upper mode of the stop band, the upper end frequency ft2 of the stop band of the IDT 12 can be set between the lower end frequency fr1 of the stop band of the reflector 20 and the upper end frequency fr2 of the stop band of the reflector 20, as shown in FIG. 40. That is, the frequencies can be set to satisfy the following expression (18).

$$fr1 < ft2 < fr2 \qquad (18)$$

Accordingly, a reflection coefficient Γ of the reflector 20 becomes greater at the upper end frequency ft2 of the stop band of the IDT 12 and the SAW in the upper mode of the stop band excited from the IDT 12 is reflected to the IDT 12 by the reflector 20 with a high reflection coefficient. The energy trapping force of the SAW in the upper mode of the stop band is strengthened, thereby realizing a resonator with low loss.

On the other hand, when the relationship among the upper end frequency ft2 of the stop band of the IDT 12, the lower end frequency fr1 of the stop band of the reflector 20, and the upper end frequency fr2 of the stop band of the reflector 20 is set to ft2<fr1 or fr2<ft2, the reflection coefficient Γ of the reflector 20 at the upper end frequency ft2 of the stop band of the IDT 12 becomes small, and thus, it is difficult to obtain the strong energy trapping.

Here, in order to realize the state expressed by the expression (18), it is necessary to frequency-shift the stop band of the reflector 20 to the higher band side than the stop band of the IDT 12. Specifically, this state can be realized by setting the arrangement pitch of the conductor strips 22 of the reflector 20 to be smaller than the arrangement pitch of the electrode fingers 18 of the IDT 12. In another method, the thickness of the electrode film formed as the conductor strips 22 of the reflector 20 can be set to be smaller than the thickness of the electrode film formed as the electrode fingers 18 of the IDT 12 or the depth of the inter-conductor-strip groove of the reflector 20 can be set to be smaller than the depth of the inter-electrode-finger groove of the IDT 12. A plurality of the methods may be combined.

Figure 38:
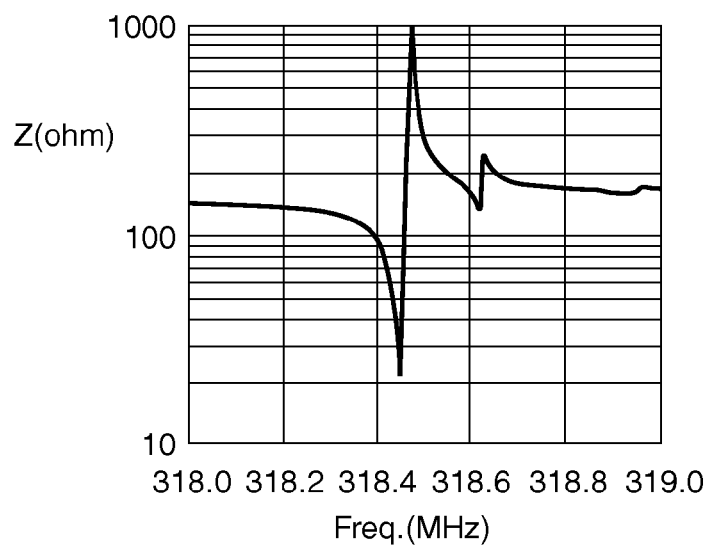
FIG. 38 is a diagram illustrating impedance curve data in the SAW device according to the embodiment of the invention.

According to FIG. 37, it is possible to obtain a high figure of merit M in addition to the increase in Q value. FIG. 38 is a graph illustrating the relationship between the impedance Z and the frequency in the SAW device having the characteristics shown in FIG. 37. It can be seen from FIG. 38 that no useless spurious resonance exists in the vicinity of the resonance point.

In the IDT 12 of the SAW device 10 according to this embodiment, all the electrode fingers are alternately intersected. However, the SAW device 10 according to the invention can exhibit the considerable advantage using only the quartz substrate. Accordingly, even when the electrode fingers 18 of the IDT 12 are thinned out, the same advantage can be obtained.

Further, the grooves 32 may be disposed partially between the electrode fingers 18 or between the conductor strips 22 of the reflector 20. Particularly, since the center portion of the IDT 12 with a high vibration displacement greatly affects the frequency temperature characteristic, the grooves 32 may be disposed only in the center portion. With this configuration, it is possible to provide the SAW device 10 with an excellent frequency temperature characteristic.

Next, a SAW device according to a second embodiment of the invention will be described. The SAW device according to this embodiment is different from the SAW device according to the above-described first embodiment in that the ranges of the Euler angles on the quartz substrate to be used are changed. Specifically, a second quartz substrate in which an approximate curve based on a polynomial expression is calculated on the basis of the plot in FIG. 42 to determine the Euler angles may be used. The Euler angles of the second quartz angle calculated as described above may be determined in the range of ($-60° \leq \phi \leq 60°$, $6.7778 \times 10^{-7} \times |\phi|^6 - 1.2200 \times 10^{-4} \times |\phi|^5 + 8.1111 \times 10^{-3} \times |\phi|^4 - 2.4133 \times 10^{-1} \times |\phi|^3 + 3.0521 \times |\phi|^2 - 1.2247 \times 10 \times |\phi| + 1.1700 \leq \theta \leq 6.7778 \times 10^{-7} \times |\phi|^6 - 1.2200 \times 10^{-4} \times |\phi|^5 + 8.1111 \times 10^{-3} \times |\phi|^4 - 2.4133 \times 10^{-1} \times |\phi|^3 + 3.0521 \times |\phi|^2 - 1.2247 \times 10 \times |\phi| + 1.4200$, $2.7816 \times 10^{-9} \times |\phi|^6 + 2.7322 \times 10^{-17} \times |\phi|^5 - 1.7524 \times 10^{-5} \times |\phi|^4 - 1.1334 \times 10^{-13} \times |\phi|^3 + 2.7035 \times 10^{-2} \times |\phi|^2 - 9.9045 \times 10^{-10} \times |\phi| + 1.3504 \times 10^2 \leq \psi \leq 2.7816 \times 10^{-9} \times |\phi|^6 + 2.7322 \times 10^{-17} \times |\phi|^5 - 1.7524 \times 10^{-5} \times |\phi|^4 - 1.1334 \times 10^{-13} \times |\phi|^3 + 2.7035 \times 10^{-2} \times |\phi|^2 - 9.9045 \times 10^{-10} \times |\phi| + 1.427 \times 10^2$). Since the other configuration is the same as that of the SAW device according to the first embodiment, FIGS. 1A to 1C are used for the entire configuration.

The secondary temperature coefficient value becomes the minimum where the electrode film thickness of the IDT for the second quartz substrate expressed by the Euler angles is 0.06λ, and the line occupancy η is in the range of $0.49 \leq \eta \leq 0.70$. In the SAW device according to this embodiment with such a configuration, the secondary temperature coefficient β may also be in the range of $\beta = \pm 0.010$ ppm/° C.². As described above, if the secondary temperature coefficient β becomes small, it means that the frequency temperature characteristic becomes excellent. Accordingly, in the SAW device with the quartz substrate according to this embodiment, it is also possible to achieve an excellent frequency temperature characteristic.

Next, a SAW device according to a third embodiment of the invention will be described. The SAW device according to this embodiment is different from the SAW devices according to the above-described first and second embodiments in that the ranges of the Euler angles on the quartz substrate to be used are changed. Specifically, a third quartz substrate in which an approximate curve based on a polynomial expression is calculated on the basis of the plot in FIG. 43 to determine the Euler angles may be used. The Euler angles of the third quartz angle calculated as described above may be determined in the range of ($-60° \leq \phi \leq 60°$, $-2.5000 \times 10^{-8} \times |\phi|^6 + 4.5000 \times 10^{-6} \times |\phi|^5 - 3.1667 \times 10^{-4} \times |\phi|^4 + 1.1000 \times 10^{-2} \times |\phi|^3 - 1.8308 \times 10^{-1} \times |\phi|^2 + 9.0500 \times 10 \times |\phi| - 3.2000 \times 10 \leq \theta \leq -2.5000 \times 10^{-8} \times |\phi|^6 + 4.5000 \times 10^{-6} \times |\phi|^5 - 3.1667 \times 10^{-4} \times |\phi|^4 + 1.1000 \times 10^{-2} \times |\phi|^3 - 1.8308 \times 10^{-1} \times |\phi|^2 + 9.0500 \times 10^{-1} \times |\phi| + 5.7000 \times 10$, $-4.3602 \times 10^{-9} \times |\phi|^6 - 1.2360 \times 10^{-17} \times |\phi|^5 + 2.7151 \times 10^{-5} \times |\phi|^4 + 3.2536 \times 10^{-14} \times |\phi|^3 - 4.1462 \times 10^{-2} \times |\phi|^2 - 9.4085 \times 10^{-10} \times |\phi| + 8.9090 \times 10 \leq \psi \leq -4.3602 \times 10^{-9} \times |\phi|^6 - 1.2360 \times 10^{-17} \times |\phi|^5 + 2.7151 \times 10^{-5} \times |\phi|^4 + 3.2536 \times 10^{-14} \times |\phi|^3 - 4.1462 \times 10^{-2} \times |\phi|^2 - 9.4085 \times 10^{-10} \times |\phi| + 9.6760 \times 10$). Since the other configuration is the same as those of the SAW devices according to the first and second embodiments, FIGS. 1A to 1C are used for the entire configuration.

The electrode film thickness of the IDT for the third quartz substrate expressed by the Euler angles is 0.06λ, and the line occupancy η is in the range of $0.49 \leq \eta \leq 0.70$. In the SAW device according to this embodiment with such a configuration, the secondary temperature coefficient β may also be in the range of $\beta = \pm 0.010$ ppm/° C.². Accordingly, it is possible to achieve an excellent frequency temperature characteristic, in a similar way to the above-mentioned embodiments.

Further, in the above-mentioned embodiment, Al or an alloy containing Al as a main component is used for the electrode films. However, another metal may be used for the electrode films as long as it provides the same advantages as the above-mentioned embodiment.

In the above-mentioned embodiment, the SAW device is simply described, but the SAW filter may be employed as the SAW device according to the invention. Further, although a one-terminal-pair SAW device having only one IDT is exemplified in the above-mentioned embodiment, the invention can be applied to a two-terminal-pair SAW device having plural IDTs and can be also applied to a vertical-coupling or horizontal-coupling double-mode SAW filter or multimode SAW filter.

Figure 44A:
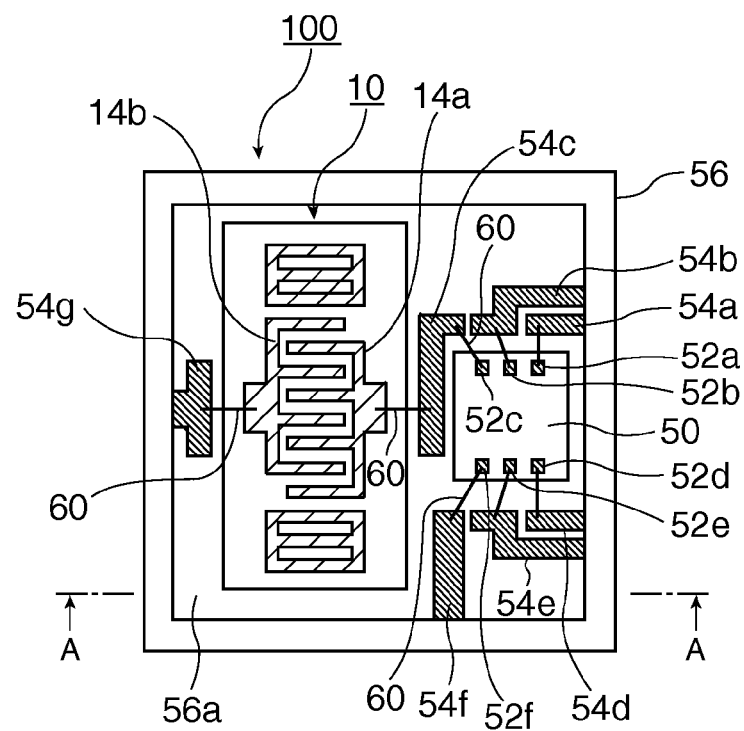
FIGS. 44A and 44B are diagrams illustrating a configuration of an SAW oscillator according to an embodiment of the invention.
Figure 44B:
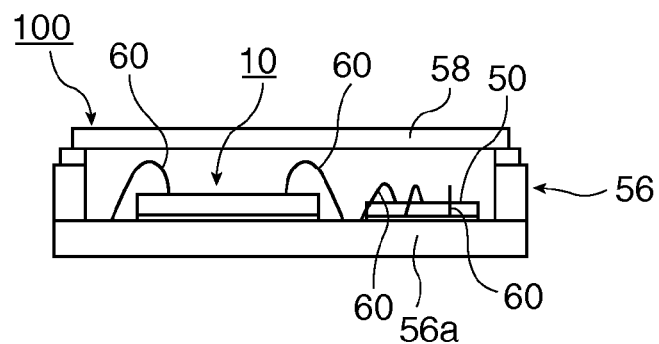

An SAW oscillator according to an embodiment of the invention will be described with reference to FIGS. 44A and 44B. As shown in FIGS. 44A and 44B, the SAW oscillator according to this embodiment includes the above-mentioned SAW device 10, an IC (Integrated Circuit) 50 which controls the driving of the SAW device by applying voltage to the IDT 12 of the SAW device 10, and a package which accommodates the elements. FIG. 44A is a plan view in which the lid is excluded and FIG. 44B is a sectional view taken along line A-A of FIG. 43A.

In the SAW oscillator 100 according to this embodiment, the SAW device 10 and the IC 50 are accommodated in the same package 56, and electrode patterns 54a to 54g formed on a bottom plate 56a of the package 56, pectinate electrodes 14a and 14b of the SAW device 10, and pads 52a to 52f of the IC 50 are connected to each other by metal wires 60. Further, a cavity of the package 56 receiving the SAW device 10 and the IC 50 is air-tightly sealed with a lid 58. According to this configuration, the IDT 12 (see FIGS. 1A to 1C), the IC 50, and external mounting electrodes (not shown) formed on the bottom surface of the package 56 can be electrically connected to each other.

Further, the SAW device according to this embodiment of the invention can be used as a clock source in a mobile phone or a hard disk, a server computer, and a wired or wireless base station. An electronic apparatus according to an embodiment of the invention is achieved by mounting the above-described SAW device on the mobile phone, the hard disk, or the like.

What is claimed is:
1. A surface acoustic wave device comprising:
an IDT which is disposed on a main plane of any one of a first quartz substrate with Euler angles of ($-60° \leq \phi \leq 60°$, $1.7845 \times 10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.1803 \times 10^2 \leq \theta \leq 1.7845 \times$

$10^{-9} \times |\phi|^6 + 2.2009 \times 10^{-17} \times |\phi|^5 - 1.1608 \times 10^{-5} \times |\phi|^4 - 4.6486 \times 10^{-13} \times |\phi|^3 + 1.8409 \times 10^{-2} \times |\phi|^2 - 3.1338 \times 10^{-9} \times |\phi| + 1.4303 \times 10^2$, $2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.2235 \times 10 \leq \psi \leq 2.5961 \times 10^{-9} \times |\phi|^6 + 1.2224 \times 10^{-17} \times |\phi|^5 - 1.6416 \times 10^{-5} \times |\phi|^4 - 3.2260 \times 10^{-13} \times |\phi|^3 + 2.5407 \times 10^{-2} \times |\phi|^2 - 1.2131 \times 10^{-9} \times |\phi| + 4.9905 \times 10$), a second quartz substrate with Euler angles of ($-60° \leq \phi \leq 60°$, $6.7778 \times 10^{-7} \times |\phi|^6 - 1.2200 \times 10^{-4} \times |\phi|^5 + 8.1111 \times 10^{-3} \times |\phi|^4 - 2.4133 \times 10^{-1} \times |\phi|^3 + 3.0521 \times |\phi|^2 - 1.2247 \times 10 \times |\phi| + 1.1700 \leq \theta \leq 6.7778 \times 10^{-7} \times |\phi|^6 - 1.2200 \times 10^{-4} \times |\phi|^5 + 8.1111 \times 10^{-3} \times |\phi|^4 - 2.4133 \times 10^{-1} \times |\phi|^3 + 3.0521 \times |\phi|^2 - 1.2247 \times 10 \times |\phi| + 1.4200$, $2.7816 \times 10^{-9} \times |\phi|^6 + 2.7322 \times 10^{-17} \times |\phi|^5 - 1.7524 \times 10^{-5} \times |\phi|^4 - 1.1334 \times 10^{-13} \times |\phi|^3 + 2.7035 \times 10^{-2} \times |\phi|^2 - 9.9045 \times 10^{-10} \times |\phi| + 1.3504 \times 10^2 \leq \psi \leq 2.7816 \times 10^{-9} \times |\phi|^6 + 2.7322 \times 10^{-17} \times |\phi|^5 - 1.7524 \times 10^{-5} \times |\phi|^4 - 1.1334 \times 10^{-13} \times |\phi|^3 + 2.7035 \times 10^{-2} \times |\phi|^2 - 9.9045 \times 10^{-10} \times |\phi| + 1.427 \times 10^2$), and a third quartz substrate with Euler angles of ($-60° \leq \phi \leq 60°$, $-2.5000 \times 10^{-8} \times |\phi|^6 + 4.5000 \times 10^{-6} \times |\phi|^5 - 3.1667 \times 10^{-4} \times |\phi|^4 + 1.1000 \times 10^{-2} \times |\phi|^3 - 1.8308 \times 10^{-1} \times |\phi|^2 + 9.0500 \times 10^{-1} \times |\phi| + 3.2000 \times 10 \leq \theta \leq -2.5000 \times 10^{-8} \times |\phi|^6 + 4.5000 \times 10^{-6} \times |\phi|^5 - 3.1667 \times 10^{-4} \times |\phi|^4 + 1.1000 \times 10^{-2} \times |\phi|^3 - 1.8308 \times 10^{-1} \times |\phi|^2 + 9.0500 \times 10^{-1} \times |\phi| + 5.7000 \times 10$, $-4.3602 \times 10^{-9} \times |\phi|^6 - 1.2360 \times 10^{-17} \times |\phi|^5 + 2.7151 \times 10^{-5} \times |\phi|^4 + 3.2536 \times 10^{-14} \times |\phi|^3 - 4.1462 \times 10^{-2} \times |\phi|^2 - 9.4085 \times 10^{-10} \times |\phi| + 8.9090 \times 10 \leq \psi \leq -4.3602 \times 10^{-9} \times |\phi|^6 - 1.2360 \times 10^{-17} \times |\phi|^5 + 2.7151 \times 10^{-5} \times |\phi|^4 + 3.2536 \times 10^{-14} \times |\phi|^3 - 4.1462 \times 10^{-2} \times |\phi|^2 - 9.4085 \times 10^{-10} \times |\phi| + 9.6760 \times 10$), and which excites a surface acoustic wave in an upper mode of a stop band.

2. The surface acoustic wave device according to claim 1, wherein an inter-electrode-finger groove is formed by recessing the substrate disposed between electrode fingers which form the IDT.

3. The surface acoustic wave device according to claim 1, wherein when one of the first, second and third quartz substrates is used, a line occupancy $\eta$ of the IDT satisfies the following expression:

$$0.49 \leq \eta \leq 0.70.$$

4. The surface acoustic wave device according to claim 1, wherein where the depth of the inter-electrode-finger groove is G, G satisfies the following expression:

$$0.02\lambda \leq G \leq 0.04\lambda.$$

5. A surface acoustic wave oscillator comprising the surface acoustic wave device according to claim 1.

6. A surface acoustic wave oscillator comprising the surface acoustic wave device according to claim 2.

7. A surface acoustic wave oscillator comprising the surface acoustic wave device according to claim 3.

8. A surface acoustic wave oscillator comprising the surface acoustic wave device according to claim 4.

9. An electronic apparatus comprising the surface acoustic wave device according to claim 1.

10. An electronic apparatus comprising the surface acoustic wave device according to claim 2.

11. An electronic apparatus comprising the surface acoustic wave device according to claim 3.

12. An electronic apparatus comprising the surface acoustic wave device according to claim 4.

* * * * *